(12) United States Patent
Mulfinger et al.

(10) Patent No.: US 10,673,189 B2
(45) Date of Patent: Jun. 2, 2020

(54) POWER CONNECTOR ASSEMBLY FOR A COMMUNICATION SYSTEM

(71) Applicant: TE CONNECTIVITY CORPORATION, Berwyn, PA (US)

(72) Inventors: Robert Neil Mulfinger, York Haven, PA (US); Jason M'Cheyne Reisinger, Carlisle, PA (US); Matthew Grimm, Leander, TX (US); Michael David Herring, Apex, NC (US); Sean Patrick Kelly, York, PA (US); Christopher William Blackburn, Bothell, WA (US); Patrick Di Paola, Mechanicsburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/410,007

(22) Filed: May 13, 2019

(65) Prior Publication Data

US 2019/0379170 A1    Dec. 12, 2019

Related U.S. Application Data

(60) Provisional application No. 62/681,470, filed on Jun. 6, 2018.

(51) Int. Cl.
*H01R 25/14*    (2006.01)
*H01R 41/00*    (2006.01)

(52) U.S. Cl.
CPC ......... *H01R 25/145* (2013.01); *H01R 25/142* (2013.01); *H01R 41/00* (2013.01)

(58) Field of Classification Search
CPC ...... H01R 41/00; H01R 25/142; H01R 25/14; H05K 7/1492
USPC .................................. 439/32, 110, 121, 122
See application file for complete search history.

(56) References Cited

U.S. PATENT DOCUMENTS

| 3,603,918 A | * | 9/1971 | Woertz ................. H01R 25/142 |
| | | | 439/115 |
| 3,639,885 A | | 2/1972 | Yoshiya et al. |
| 3,772,482 A | | 11/1973 | Ross, Jr. |
| 4,245,873 A | | 1/1981 | Markowitz |

(Continued)

FOREIGN PATENT DOCUMENTS

| CN | 102037616 B | 5/2014 |
| CN | 102232260 B | 9/2017 |

(Continued)

*Primary Examiner* — Ross N Gushi

(57) ABSTRACT

A power connector assembly includes a power rail and a slide power connector. The power rail is mounted to a first wall of a first component via mechanical standoffs to define a clearance space between the power rail and the first wall. An electrode is disposed along a first side of the power rail facing the first wall. The slide power connector is mounted to a second wall of a discrete, second component. The slide power connector defines a track that receives the power rail therein. At least one power contact of the slide power connector is disposed within the clearance space and is electrically connected to the electrode of the power rail to establish an electrical connection. At least one of the first and second components is movable relative to the other along an extension cycle. The electrical connection is maintained throughout the extension cycle.

20 Claims, 13 Drawing Sheets

(56) References Cited

U.S. PATENT DOCUMENTS

| | | | |
|---|---|---|---|
| 4,690,474 A * | 9/1987 | Smart | H01R 13/44 439/120 |
| 4,949,487 A * | 8/1990 | Kibarer | G09F 13/28 362/404 |
| 5,052,937 A * | 10/1991 | Glen | H01R 25/14 439/120 |
| 5,151,038 A * | 9/1992 | Range | H01R 25/142 439/122 |
| 5,259,774 A * | 11/1993 | Gabrius | F21V 21/35 439/110 |
| 5,418,328 A | 5/1995 | Nadeau | |
| 5,582,520 A * | 12/1996 | Doudon | H01R 25/142 439/106 |
| 5,599,086 A * | 2/1997 | Dutta | B60Q 3/53 296/214 |
| 5,664,953 A | 9/1997 | Reylek | |
| 5,759,051 A * | 6/1998 | Cancellieri | H01R 25/142 439/118 |
| 5,803,755 A * | 9/1998 | Kuchar | H01R 25/14 439/110 |
| 5,895,275 A | 4/1999 | Harbertson | |
| 5,993,222 A | 11/1999 | Nicolette et al. | |
| 6,004,138 A | 12/1999 | Harbertson | |
| 6,056,561 A * | 5/2000 | Lin | H01R 25/142 439/121 |
| 6,059,582 A * | 5/2000 | Tsai | H01R 25/142 362/287 |
| 6,203,088 B1 | 3/2001 | Fernandez et al. | |
| 6,205,029 B1 | 3/2001 | Byrne et al. | |
| 6,239,975 B1 | 5/2001 | Otis | |
| 6,325,645 B1 * | 12/2001 | Schuite | A47G 1/1686 439/110 |
| 6,424,525 B1 | 7/2002 | MacLeod et al. | |
| 6,439,900 B1 | 8/2002 | Sward | |
| 6,445,571 B1 | 9/2002 | Inniss et al. | |
| 6,655,977 B2 | 12/2003 | Ives et al. | |
| 6,790,059 B2 | 9/2004 | Pochlau | |
| 6,827,592 B2 | 12/2004 | McCoy et al. | |
| 6,921,278 B2 | 7/2005 | Ives et al. | |
| 7,094,077 B1 * | 8/2006 | Chen | H01R 25/142 439/118 |
| 7,142,411 B2 | 11/2006 | McLeod | |
| 7,186,118 B2 | 3/2007 | Hansen et al. | |
| 7,258,555 B2 * | 8/2007 | Tiesler | B60R 16/03 439/110 |
| 7,403,396 B2 | 7/2008 | Belady et al. | |
| 7,438,566 B2 * | 10/2008 | Chen | H01R 25/145 439/110 |
| 7,520,763 B1 | 4/2009 | Buse | |
| 7,597,565 B1 * | 10/2009 | Jorgensen | H01R 43/10 439/111 |
| 7,661,966 B2 | 2/2010 | Ohanesian | |
| 7,669,271 B2 | 3/2010 | Gonzalez Alemany et al. | |
| 7,722,367 B2 * | 5/2010 | Jong | H01R 25/14 439/118 |
| 7,744,386 B1 * | 6/2010 | Speidel | H01R 25/145 439/118 |
| 7,784,888 B2 * | 8/2010 | Oh | A47B 51/00 312/223.6 |
| 7,819,676 B1 * | 10/2010 | Cardoso | H01R 13/245 439/115 |
| 7,833,027 B2 | 11/2010 | Jong | |
| 7,940,504 B2 | 5/2011 | Spitaels et al. | |
| 8,109,652 B2 * | 2/2012 | Chen | F21V 19/0045 362/249.02 |
| 8,118,606 B2 * | 2/2012 | Larsson | H01R 13/642 439/110 |
| 8,212,427 B2 | 7/2012 | Spitaels et al. | |
| 8,419,450 B2 | 4/2013 | Schmiedle et al. | |
| 8,469,726 B2 * | 6/2013 | Perales Fayos | H01R 25/142 439/110 |
| 8,491,343 B2 * | 7/2013 | Wang | H01R 25/006 439/640 |
| 8,616,921 B2 * | 12/2013 | Byrne | H01R 25/00 439/214 |
| 8,814,383 B2 | 8/2014 | Bizzotto et al. | |
| 8,899,780 B2 | 12/2014 | Masik et al. | |
| 8,911,251 B2 * | 12/2014 | Ehlen | H05K 7/1489 439/215 |
| 8,986,021 B2 * | 3/2015 | Keswani | H01R 25/142 439/110 |
| 9,128,682 B2 | 9/2015 | Dean et al. | |
| 9,130,327 B2 * | 9/2015 | Flynn | H01R 25/14 |
| 9,379,503 B2 | 6/2016 | Bonzi et al. | |
| 9,379,504 B2 | 6/2016 | Chinn | |
| 9,450,358 B2 * | 9/2016 | Ehlen | H01R 25/14 |
| 9,559,474 B2 * | 1/2017 | Chen | H01R 25/145 |
| 9,608,392 B1 * | 3/2017 | Destro | H01R 9/26 |
| 9,693,477 B1 | 6/2017 | Ehlen | |
| 9,985,403 B1 * | 5/2018 | Herring | H01R 41/00 |
| 10,015,903 B1 * | 7/2018 | Ehlen | H05K 7/1492 |
| 2006/0012977 A1 * | 1/2006 | Joseph | F21V 21/35 362/147 |
| 2008/0090432 A1 * | 4/2008 | Patterson | H01R 25/142 439/121 |
| 2008/0106892 A1 * | 5/2008 | Griffiths | F21V 11/10 362/223 |
| 2008/0144293 A1 * | 6/2008 | Aksamit | H05K 7/1489 361/727 |
| 2009/0034181 A1 * | 2/2009 | Gizycki | H01R 13/652 361/679.02 |
| 2009/0058357 A1 * | 3/2009 | Saker | B62B 3/1404 320/107 |
| 2010/0103687 A1 | 4/2010 | Pitlor | |
| 2010/0330817 A1 | 12/2010 | van Ekstrom | |
| 2012/0039032 A1 | 2/2012 | Archibald et al. | |
| 2013/0052840 A1 | 2/2013 | Wang et al. | |
| 2014/0159968 A1 | 6/2014 | Maier et al. | |
| 2017/0033521 A1 | 2/2017 | Wessel | |
| 2017/0033522 A1 | 2/2017 | Nicieja et al. | |
| 2018/0212390 A1 * | 7/2018 | Herring | H01R 41/00 |

FOREIGN PATENT DOCUMENTS

| | | |
|---|---|---|
| GB | 1 281 062 A | 7/1972 |
| WO | 2009117679 A2 | 9/2009 |
| WO | 2012113807 A1 | 8/2012 |

* cited by examiner

POWER CONNECTOR ASSEMBLY FOR A COMMUNICATION SYSTEM

CROSS REFERENCE TO RELATED APPLICATIONS

This application claims benefit to U.S. Provisional Application No. 62/681,470, filed Jun. 6, 2018 and titled "Power Connector Assembly For A Communication System;" the subject matter of which is herein incorporated by reference in its entirety.

BACKGROUND OF THE INVENTION

The subject matter herein relates generally to power connector assemblies for communication systems.

Some communication systems include an equipment cabinet holding communication equipment in an equipment rack. The equipment racks are typically slidable or extendable, such as in a drawer, between closed and open positions. For example, the equipment rack may be slid open to access components of the communication system, such as electrical components mounted on a circuit board within the drawer, for service, testing and the like. Typically, the electrical components are powered through a power supply of the communication system. However, in some applications it may be desirable to maintain the equipment in a powered and operating state during service. Conventional communication systems that maintain power to the electrical components during service use power wires connected to the circuit board that are extendible with the equipment rack. The power wires need to be long enough to accommodate the full extension of the equipment rack so that as the equipment rack travels the power wires may extend or contract within a defined space without being damaged or causing damage to other components.

Conventional communication systems having power wires are not without disadvantages. For instance, the power wires occupy valuable space within the equipment rack which could otherwise be used for increasing ventilation through the equipment cabinet or additional electrical components if the power wires were removed. Additionally, the communication systems having the power wires typically include a cable management arm to guide extension and contraction of the power wire within the equipment cabinet. The cable management arm occupies additional space within the equipment cabinet. Furthermore, as power requirements to the communication system increase, the size and/or quantity of power wires needed to support the current increases, thereby leading to larger and stiffer wire bundles.

A need remains for a power connector assembly for powering electrical components within an extendible equipment rack of a communication system.

BRIEF DESCRIPTION OF THE INVENTION

In one or more embodiments of the present disclosure, a power connector assembly is provided that includes a power rail and a slide power connector. The power rail is mounted to a first wall of a first component via mechanical standoffs that suspend the power rail a distance away from the first wall to define a clearance space between the power rail and the first wall. The mechanical standoffs span the clearance space. The power rail has a positive electrode disposed along a first side of the power rail facing the first wall. The slide power connector includes a housing and power contacts held in the housing. The slide power connector is mounted to a second wall of a second component that is discrete from the first component. The housing defines a track that receives the power rail therein. At least one of the power contacts is disposed within the clearance space and is electrically connected to the positive electrode of the power rail to establish an electrical connection between the slide power connector and the power rail. At least one of the first and second components is configured to be moved relative to the other of the first and second components along an extension cycle. The electrical connection between the slide power connector and the power rail is maintained throughout the extension cycle.

In one or more embodiments, a power connector assembly is provided that includes a power rail and a slide power connector. The power rail is mounted to a panel of a chassis via mechanical standoffs that suspend the power rail a distance away from the panel to define a clearance space between the power rail and the panel. The mechanical standoffs span the clearance space. The power rail has a power supply circuit electrically connected to a power supply. The power supply circuit includes a positive electrode disposed along an outer side of the power rail facing the panel. The slide power connector is mounted to a drawer that is held by the chassis. The drawer is slidable relative to the chassis along an extension cycle. The slide power connector is electrically connected to one or more electrical devices disposed within a cavity of the drawer via power wires that extend into the cavity. The slide power connector has power contacts electrically connected to the power supply circuit of the power rail. At least one of the power contacts is disposed within the clearance space and is electrically connected to the positive electrode to establish an electrical connection between the slide power connector and the power rail. The slide power connector is configured to slide along the power rail as the drawer is moved relative to the chassis. The power contacts maintain electrical connection with the power supply circuit throughout the extension cycle.

In one or more embodiments, a power connector assembly is provided that includes a power rail and a slide power connector. The power rail is mounted to a first wall of a first component via mechanical standoffs that suspend the power rail a distance away from the first wall to define a clearance space between the power rail and the first wall. The mechanical standoffs span the clearance space. The power rail has a positive electrode disposed along a first side of the power rail facing the first wall and has a negative electrode disposed along a second side of the power rail that is opposite the first side. The slide power connector includes a housing and power contacts. The slide power connector is mounted to a second wall of a second component that is discrete from the first component. The housing includes a rail and first and second walls that extend from the rail. The housing configured to straddle an edge of the power rail such that the first wall is disposed along the first side of the power rail within the clearance space and the second wall is disposed along the second side of the power rail. The first wall holds at least a first power contact of the power contacts that is electrically connected to the positive electrode, and the second wall holds at least a second power contact of the power contacts that is electrically connected to the negative electrode. At least one of the first and second components is configured to be moved relative to the other of the first and second components along an extension cycle. The electrical connection between the slide power connector and the power rail is maintained throughout the extension cycle.

DETAILED DESCRIPTION OF THE INVENTION

Figure 1:
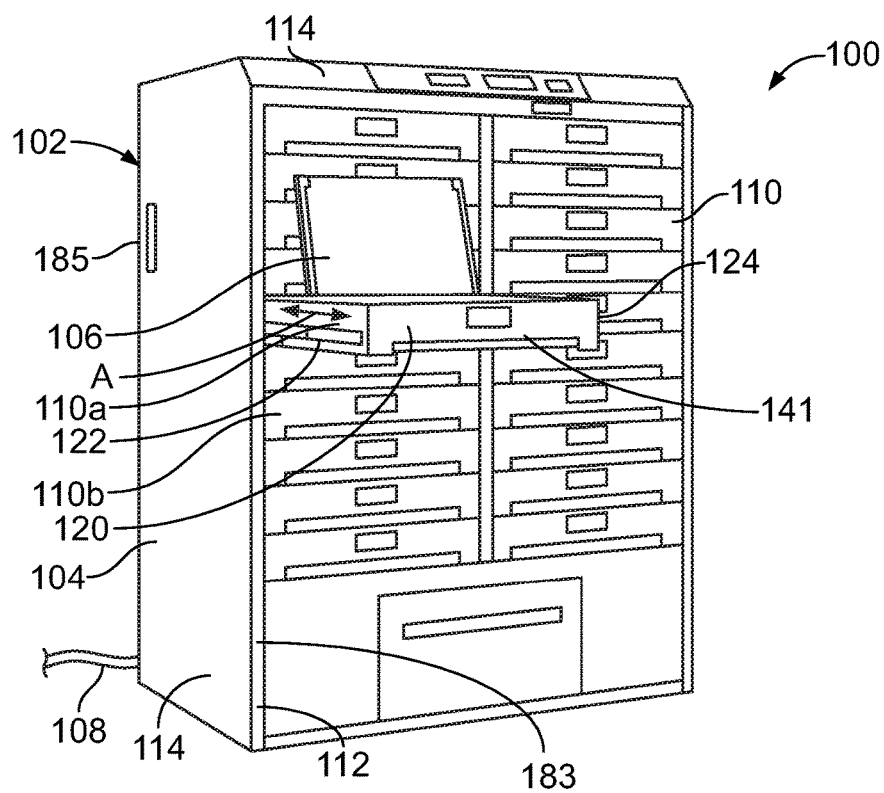
FIG. 1 illustrates a communication system in accordance with an embodiment.

FIG. 1 illustrates a communication system 100 in accordance with an embodiment. The communication system 100 includes an equipment cabinet 102 having a chassis 104 and equipment racks 110 held by the chassis 104. The equipment racks 110 include drawers 120 and communication equipment 106 held within the drawers 120. The equipment cabinet 102 has a power supply 108 configured to supply power to the communication equipment 106. The equipment racks 110 are slidable between closed and open positions relative to the chassis 104. For example, FIG. 1 illustrates one of the equipment racks 110a in an open position and other equipment racks 110b in a closed position. The equipment racks 110 in the closed positions are enclosed within the chassis 104 such that the communication equipment 106 within the racks 110 is not accessible to an operator from outside of the equipment cabinet 102. The equipment racks 110 are opened by pulling or otherwise extending the racks 110 away from the chassis 104 to access the communication equipment 106 for use, repair and/or replacement. In an embodiment, the communication equipment 106 is powered by the power supply 108 when the equipment rack 110 is in the closed position and in the open position. For example, when the equipment rack 110 is open, the communication system 100 maintains the communication equipment 106 in a powered and operating state, such as during use and/or during service.

The chassis 104 may have any size or shape depending on the particular application. The chassis 104 may hold any number of equipment racks 110. In the illustrated embodiment, the equipment racks 110 are stacked in two columns; however, the equipment racks 110 may have other configurations in alternative embodiments, such as stacked in a single column. In the illustrated embodiment, the equipment racks 110 are oriented horizontally; however, the equipment racks 110 may have other orientations, such as a vertical orientation, in alternative embodiments.

The chassis 104 has frame supports 112 that define a frame to support the equipment racks 110 and/or the communication equipment 106. The chassis 104 may also include panels 114 extending between the frame supports 112. The panels 114 may be side panels that define an exterior of the equipment cabinet 102 and/or may be divider panels that extend between adjacent equipment racks 110. In other embodiments, the chassis 104 may be open, only including the frame supports 112 without the panels 114.

In an embodiment, each equipment rack 110 includes a respective drawer 120 that holds and supports the communication equipment 106 of the equipment rack 110. The drawer 120 includes multiple walls 124 to enclose the communication equipment 106, such as along the bottom, sides, front, back, top and/or the like. The drawer 120 may also have slides 122 used to extend the drawer 120 to the open position. The drawer 120 is extendable in a sliding direction along an extension axis, shown by arrow A. The communication equipment 106 is moveable with the drawer 120 between the closed and open positions. When the drawer 120 is in the open position, the drawer 120 projects out of a front 183 of the chassis 104 and the communication equipment 106 is accessible for use and/or for service. Other types of equipment racks 110 may be used in alternative embodiments.

In an embodiment, the communication system 100 includes power connector assemblies for powering the communication equipment 106 from the power supply 108. The power connector assemblies are arranged such that the communication equipment 106 may be powered during the entire extension cycle of the extendable equipment rack 110 between the closed position and the open position.

Figure 2:
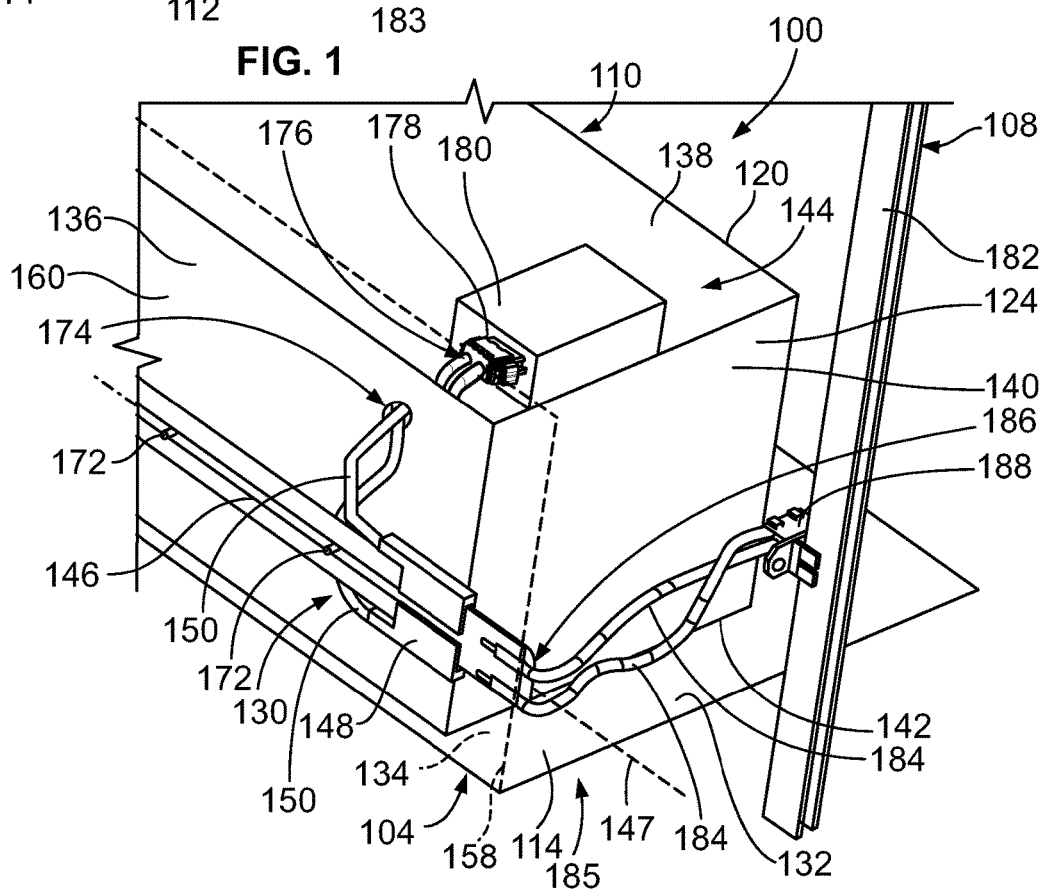
FIG. 2 is a rear perspective view of a portion of the communication system showing an equipment rack of the communication system mounted to a portion of a chassis of the communication system.

FIG. 2 is a rear perspective view of a portion of the communication system 100 showing one of the equipment racks 110 mounted to a portion of the chassis 104. FIG. 2 also illustrates a power connector assembly 130 used to power the communication equipment 106 (shown in FIG. 1) as the equipment rack 110 is opened and closed during an extension cycle of the equipment rack 110. The portion of the chassis 104 shown in FIG. 2 has multiple panels 114, including a bottom panel 132 and a side panel 134. The side panel 134 is oriented perpendicular to the bottom panel 132. The side panel 134 is shown in phantom in FIG. 2 to view the power connector assembly 130 behind the side panel 134. As used herein, relative or spatial terms such as "front," "rear," "top," "bottom," "inner," and "outer" are only used to identify and distinguish the referenced elements in the orientations shown in the illustrated figures and do not necessarily require particular positions or orientations relative to gravity and/or the surrounding environment of the communication system 100.

In an embodiment, a portion of the power connector assembly 130 is mounted to the side panel 134. The bottom panel 132 may separate the equipment rack 110 from another equipment rack 110 located below the equipment rack 110. The bottom panel 132 may be a piece of sheet metal. The bottom panel 132 is optional such that the chassis 104 in another embodiment may be provided without the bottom panel 132. In another alternative embodiment, a portion of the power connector assembly 130 is mounted to the bottom panel 132 instead of to the side panel 134.

The drawer 120 in the illustrated embodiment has multiple walls 124, including a first side wall 136, a second side wall 138 opposite the first side wall 136, a back wall 140, a front wall 141 (shown in FIG. 1) opposite the back wall 140, and a bottom wall 142. The walls 124 define a cavity 144 in which the communication equipment 106 may be stored. The slides 122 on the drawer 120 are omitted in FIG. 2. A portion of the power connector assembly 130 is mounted to the drawer 120. Specifically, a portion of the power connector assembly 130 is mounted to the first side wall 136 in the illustrated embodiment. The first side wall 136 is next to the side panel 134 of the chassis 104. A portion of the power connector assembly 130 is disposed between the first side wall 136 of the drawer 120 and the side panel 134 of the chassis 104.

The power connector assembly 130 is used to power the communication equipment 106 (FIG. 1) held within the drawer 120, regardless of the position or movement of the equipment rack 110 between the open position and the closed position. The drawer 120 and the portion of the power connector assembly 130 that is mounted to the drawer 120 are movable relative to the chassis 104 and the portion of the power connector assembly 130 that is mounted to the chassis 104. The drawer 120 is in the closed position in FIG. 2. For example, the back wall 140 of the drawer 120 is located proximate to a rear 185 of the chassis 104.

The power connector assembly 130 includes a power rail 146, a slide power connector 148, and power wires 150 that extend into the cavity 144 of the drawer 120. The slide power connector 148 is electrically connected to the power rail 146. In the embodiments described herein, the power rail 146 is fixedly mounted to a first wall 158 of one component, and the slide power connector 148 is fixedly mounted to a second wall 160 of another component that is discrete from the component that includes the first wall 158. The first wall 158 may be part of the chassis 104 or part of the drawer 120 of the equipment rack 110, and the second wall 160 is part of the other component. As the equipment rack 110 is moved along the extension cycle between the closed position and the open position, the power rail 146 and the slide power connector 148 are moved relative to one another while maintaining mechanical and electrical engagement with one another.

In the illustrated embodiment, the power rail 146 is mounted to the chassis 104, and the slide power connector 148 is mounted to the drawer 120. For example, the power rail 146 is mounted to the side panel 134 of the chassis 104 in FIG. 2, such that the side panel 134 represents the first wall 158. The slide power connector 148 is mounted to the first side wall 136 of the drawer 120, such that the first side wall 136 represents the second wall 160. The power wires 150 are connected to the slide power connector 148 and extend from the slide power connector 148 into the cavity 144 of the drawer 120. As the equipment rack 110 is moved relative to the chassis 104, the slide power connector 148 and power cables 150 move with the drawer 120. The power rail 146 has an elongated length that extends along a rail axis 147. The slide power connector 148 moves (e.g., slides) along the power rail 146 parallel to the rail axis 147. In the illustrated embodiment, the power rail 146 is mounted to the side panel 134 of the chassis 104 via mechanical standoffs or lugs 172.

The slide power connector 148 is mounted to the first side wall 136 of the drawer 120 and located between the first side wall 136 and the side panel 134 of the chassis 104. The power wires 150 are terminated (e.g., mechanically and electrically connected) to the slide power connector 148 and extend through an opening 174 in the first side wall 136 into the cavity 144. Distal ends 176 of the power wires 150 are configured to electrically connect to one or more power supply devices 180 within the cavity 144 to power the communication equipment 106 (FIG. 1). The power supply device 180 may distribute power among the various communication equipment 106 within the drawer 120. The distal ends 176 of the power wires 150 in the illustrated embodiment are terminated to a plug connector 178 for releasable mating, but may be directly electrically connected to the power supply device 180 or a circuit board via soldering, press-fit, or the like, in another embodiment.

The slide power connector 148 moves with the drawer 120 (and the communication equipment 106 therein) along the extension cycle, so the distance between the slide power connector 148 and the power supply device 180 remains constant. Thus, the power wires 150 have a length that that is sufficient to reach from the slide power connector 148 through the opening 174 in the first side wall 136 to the power supply device 180, but the power wires 150 do not have be extendible or have excess slack equal to the distance that the equipment rack 110 moves from the closed position to the open position.

The power rail 146 is electrically connected to the power supply 108. In the illustrated embodiment, the power supply 108 includes or represents a power bus bar 182 located behind the back wall 140 of the drawer 120 along a rear 185 of the chassis 104. The power bus bar 182 may be vertically oriented to extend across multiple equipment racks 110 in the cabinet 102. The power rail 146 in the illustrated embodiment is electrically connected to the power bus bar 182 via power wires 184. The power wires 184 are terminated to the power rail 146 at or proximate to a first end 186 of the power rail 146. The power wires 184 may be soldered to the power rail 146 as shown in FIG. 2, or, alternatively, the power wires 184 may be connected to a connector that is mounted at the first end 186 of the power rail 146. The opposite ends of the power wires 184 are electrically connected to the power bus bar 182 via at least one electrical connector 188. Thus, the power wires 184 convey electric current from the power bus bar 182 to the power rail 146, and the slide power connector 148 receives current from the power rail 146 and conveys the current along the power wires 150 into the cavity 144 of the drawer 120 to power the communication equipment 106 held by the equipment rack 110. In an alternative embodiment, instead of the power wires 184, the power rail 146 may be more directly connected to the power bus bar 182 via a connector that holds the power rail 146 in engagement with the power bus bar 182.

Figure 3:
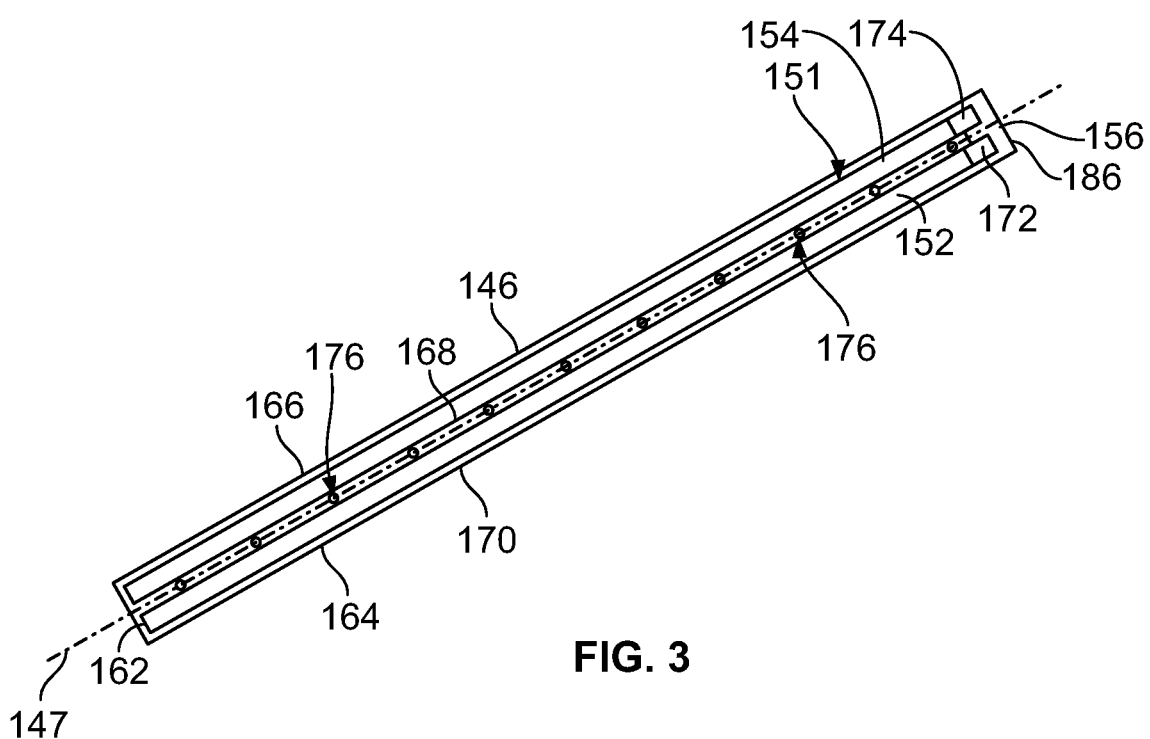
FIG. 3 illustrates a power rail of a power connector assembly of the communication system according to the embodiment shown in FIG. 2.

FIG. 3 illustrates the power rail 146 of the power connector assembly 130 according to the embodiment shown in FIG. 2. The power rail 146 includes a power supply circuit 151 for supplying power to the slide power connector 148 (shown in FIG. 2). The power supply circuit 151 includes a positive electrode or anode 152 and a negative electrode or cathode 154. The anode 152 and the cathode 154 are configured to be electrically connected to the slide power connector 148. The anode 152 may be an electrical contact strip that conveys electric current through the power rail 146 to the slide power connector 148. The cathode 154 may be an electrical contact strip that provides a ground or return path.

In one or more embodiments, the communication system 100 is arranged to be touch-safe, such that the anode 152 of the power rail 146 which is "hot" or "live" and has the potential to produce electrical shocks, is generally protected from the fingers and tools of an operator throughout the extension cycle of the equipment rack 110.

The power rail 146 extends along the rail axis 147 between the first end 186 and a second end 162 of the power rail 146 that is opposite the first end 186. The power rail 146 includes a first edge 164 and a second edge 166 opposite the first edge 164. The first and second edges 164, 166 extend between the first and second ends 186, 162. The power rail 146 includes a first side 168 and a second side 170 that is opposite the first side 168.

In the illustrated embodiment, the anode 152 and the cathode 154 are both provided along the first side 168 and extend a majority of the length between the first and second ends 186, 162. The anode 152 and the cathode 154 may be parallel conductive strips that are spaced apart from each other and therefore electrically isolated. The anode 152 and the cathode 154 are exposed along the first side 168 to engage and electrically connect to the slide power connector 148 (shown in FIG. 2). In the illustrated embodiment, the power rail 146 includes a power rail circuit board 156 with conductive traces that define the anode 152 and the cathode 154 of the power supply circuit 151. In another embodiment, the power rail 146 may be a bus bar that includes insulative dielectric material that extends between the anode 150 and the cathode 154. The dielectric material may coat the bus bar along the surface area of the bus bar other than the power supply circuit 151 to protect from electrical shocks.

The power rail 146 includes apertures 176 that extend through the power rail 146 from the first side 168 to the second side 170. The apertures 176 are configured to receive the mechanical standoffs 172 (shown in FIG. 2) for mounting and securing the power rail 146 to the chassis 104 (FIG. 2). The power rail 146 has three apertures 176 in the illustrated embodiment, but may have additional or fewer than three apertures 176 in other embodiments. Optionally, the anode 152 and the cathode 154 may include pads 172, 174, respectively, at the first end 186. The power wires 184 (shown in FIG. 2) may be terminated to the pads 172, 174 via soldering, welding, or the like.

Figure 4:
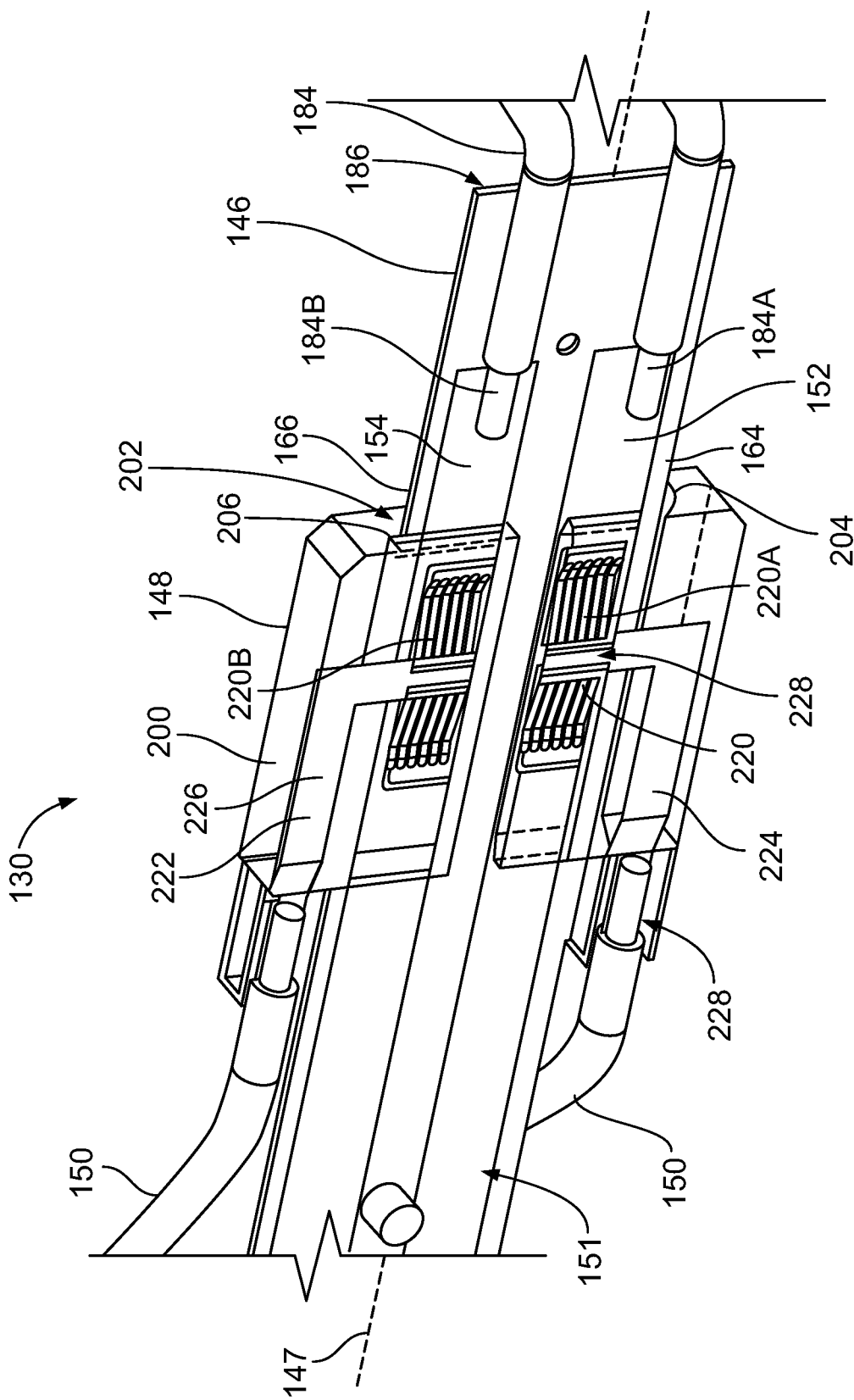
FIG. 4 is a perspective view of the power connector assembly of the communication system according to the embodiment shown in FIG. 2.

FIG. 4 is a perspective view of the power connector assembly 130 of the communication system 100 according to the embodiment shown in FIG. 2. The slide power connector 148 of the power connector assembly 130 includes a housing 200. The housing 200 is illustrated as transparent in FIG. 3 to show components located within the housing 200. The housing 200 receives the power rail 146 and slides along the power rail 146 as the equipment rack 110 (shown in FIG. 2) is opened and closed. The housing 200 includes a track 202 that receives the power rail 146. The track 202 includes a first rail 204 and as second rail 206 on opposite sides of the power rail 146. The first rail 204 engages the first edge 164 of the power rail 146. The second rail 206 engages the second edge 166 of the power rail 146 that is opposite the first edge 164. The rails 204, 206 may engage the edges 164, 166, respectively, to fix a lateral position of the slide power connector 148 relative to the power rail 146. The track 202 guides movement of the slide power connector 148 along the power rail 146 in bidirectional sliding directions parallel to the rail axis 147. The housing 200 is configured to be fixedly mounted to the drawer 120 (shown in FIG. 2) of the equipment rack 110, such that the housing 200 moves with the drawer 120 when the equipment rack 110 is opened and closed. In an alternative embodiment, the housing 200 may be fixedly mounted to the chassis 104, the power rail 146 is mounted to the equipment rack 110, and the power rail 146 moves with the drawer 120 relative to the housing 200 of the slide power connector 148.

In an embodiment, the slide power connector 148 includes a plurality of power contacts 220 held in the housing 200. The power contacts 220 are electrically connected to the power wires 150 that extend into the cavity 144 (shown in FIG. 2) of the drawer 120 (FIG. 2). For example, the power contacts 220 are mounted on a contact feed frame 222 of the slide power connector 148 that extends through the housing 200 from the power contacts 220 to the power wires 150. The contact feed frame 222 includes a positive frame member 224 and a negative (or ground) frame member 226 that is spaced apart from and electrically isolated from the positive frame member 224. The frame members 224, 226 have proximal ends 228 mechanically and electrically connected to a different one of the power wires 150, and distal ends 229 attached to a different one of the power contacts 220. The frame members 224, 226 are electrically conductive bars or strips, and convey electrical current between the power contacts 220 and the power wires 150.

With the power rail 146 received in the track 202 of the housing 200, the power contacts 220 mechanically engage and electrically connect to the power supply circuit 151 of the power rail 146. The power contacts 220 slide along the power rail 146 as the equipment rack 110 (shown in FIG. 2) is opened and closed during the extension cycle. The power contacts 220 maintain electrical connection with the power rail 146 throughout the entire extension cycle. Optionally, the power contacts 220 may be spring contacts configured to be resiliently deflected against the power rail 146. However, other types of power contacts 220 may be provided in alternative embodiments, such as spring loaded pins, such as pogo pins, wave springs, or other types of contacts, such as conductive polymer elements.

The slide power connector 148 in FIG. 4 has two power contacts 220 including a positive contact 220A and a ground (or negative) contact 220B. The positive contact 220A is attached to the positive frame member 224 and engages the positive electrode or anode 152 of the power supply circuit 151 on the power rail 146. The ground contact 220B is attached to the negative (or ground) frame member 226 and engages the cathode 154 of the power supply circuit 151. The slide power connector 148 may have more than two power contacts 220 in other embodiments, as described herein.

As shown in FIG. 4, the power wires 184 that supply current from the power bus bar 182 (shown in FIG. 2) to the power rail 146 may be directly welded (e.g., soldered, ultrasonically welded, or the like) onto the power rail 146 at or proximate to the first end 186. A first power wire 184A of the power wires 184 is directly welded to the anode 152, and a second power wire 184B is directly welded to the cathode 154.

Figure 5:
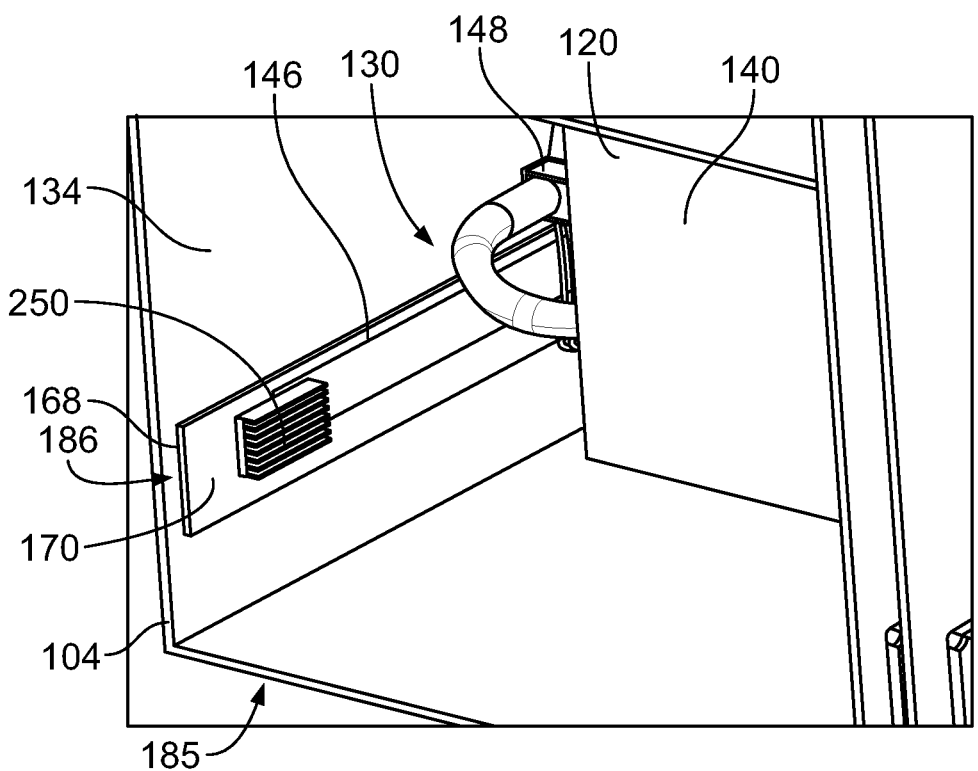
FIG. 5 is a rear perspective view of a portion of the communication system showing part of the power connector assembly according to an embodiment.

FIG. 5 is a rear perspective view of a portion of the communication system 100 showing part of the power connector assembly 130 according to an embodiment. The power wires 184 are omitted in FIG. 5 for clarity. In FIG. 5, the drawer 120 is disposed in the open position or at an intermediate location between the closed and open positions. The back side 140 of the drawer 120 is spaced apart a greater distance from the rear 185 of the chassis 104 than when the drawer 120 is in the closed position shown in FIG. 2.

Optionally, the power rail 146 may include one or more heat sinks 250. FIG. 5 shows a single heat sink 250 mounted on the second side 170 of the power rail 146. In the illustrated embodiment, the power rail 146 is mounted to the side panel 134 of the chassis 104. The first side 168 of the power rail 146 faces towards the side panel 134, and the second side 170 faces inward towards the drawer 120. As used herein, the first side 168 of the power rail 146 is referred to as an outer side 168 and the second side 170 is referred to as an inner side 170. Thus, the heat sink 250 is mounted on the inner side 170 of the power rail 146. The heat sink 250 may be disposed at or proximate to the first end 186 of the power rail 146, at the rear 185 of the chassis 104. For example, the equipment cabinet 102 (shown in FIG. 1) may have good air flow at the rear 185 of the chassis 104 that can absorb and dissipate heat from the heat sink 250. The heat sink 250 may be mounted on the power rail 146 at a location along the length of the power rail 146 that is outside of the travel path of the slide power connector 148 to avoid obstructing or interfering with the relative movement of the slide power connector 148 and power rail 146. For example, the slide power connector 148 may be located in front of the heat sink 250 throughout the extension cycle, even when the drawer 120 is in the closed position. Because the power rail 146 extends a length through the cabinet 102, the presence of the heat sink 250 and/or other heat sink members (e.g., heat pipes, etc.) attached to the power rail 146 allow the power rail 146 to also function as a thermal management device to wick heat from the cabinet 102.

Optionally, the power rail 146 may have heat transfer materials that are thermally conductive and electrically insulative. For example, the power rail 146 may have include a thermally conductive epoxy, plastic, silicone, or the like that extends along a length of the power rail 146. The heat transfer material may extend to the heat sink 250 to provide a thermally conductive path along the power rail 146 to the heat sink 250 where heat can be dissipated to air. Alternatively, the heat transfer materials could be utilized on the power rail 146 without the heat sink 250.

Figure 6:
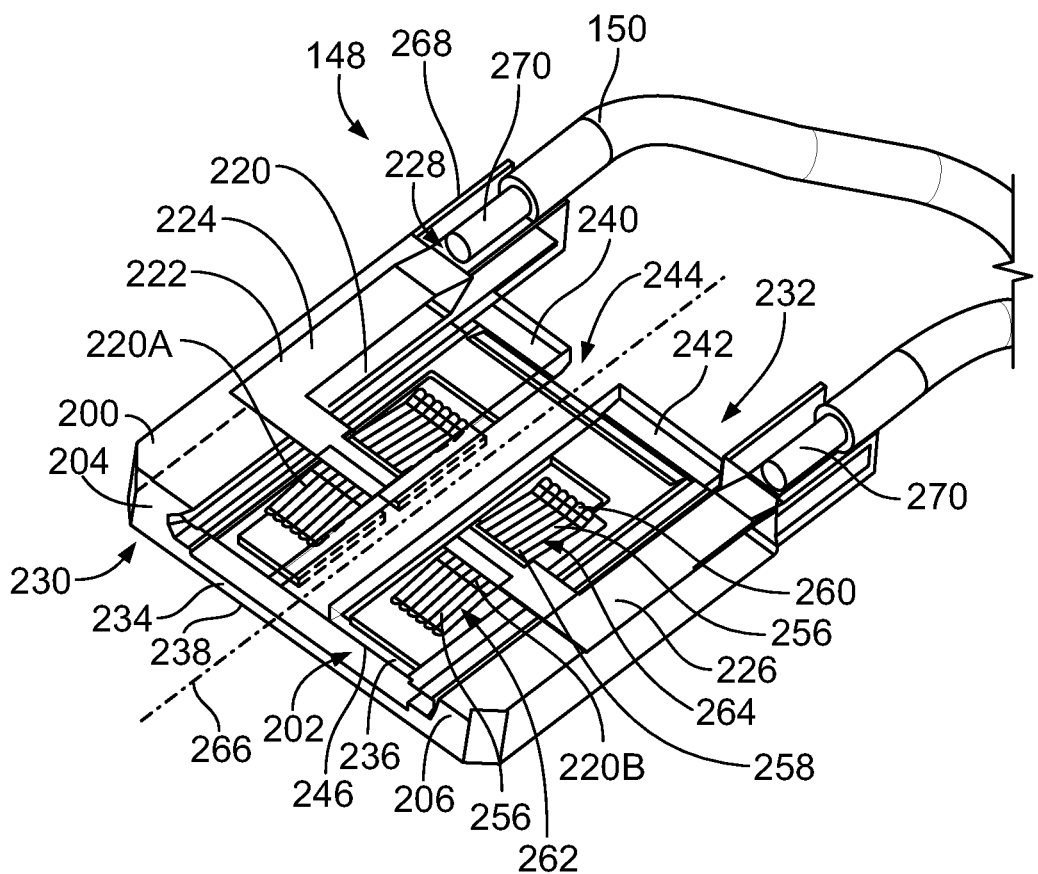
FIG. 6 is a perspective view of a slide power connector of the power connector assembly according to the embodiment shown in FIGS. 2 and 4.

FIG. 6 is a perspective view of the slide power connector 148 of the power connector assembly 130 according to the embodiment shown in FIGS. 2 and 4. The housing 200 includes a first end 230 and a second end 232 opposite the first end 230. The track 202 extends through the housing 200 from the first end 230 to the second end 232 along a longitudinal axis 266, and is open at both ends 230, 232. Each of the first and second rails 204, 206 of the housing 200 extends from the first end 230 to the second end 232. The housing 200 has a first wall 234 and a second wall 236 that longitudinally extend from the first end 230 to the second end 232 and laterally extend between the first and second rails 204, 206. The track 202 is defined between the first wall 234 and the second wall 236. The first wall 234 defines a mounting side 238 of the housing 200 that engages the drawer 120 (shown in FIG. 2) to fixedly mount the slide power connector 148 to the drawer 120.

The first wall 234 is closed such that the wall 234 extends continuously between the first and second rails 204, 206. The second wall 236 is defined by a first tab 240 that projects from the first rail 204 and a second tab 242 that projects from the second rail 206. The first tab 240 is spaced apart from the second tab 242 by a gap 244. The gap 244 longitudinally extends from the first end 230 to the second end 232. The first and second tabs 240, 242 are cantilevered from the respective rails 204, 206 and overhang or jut out over the track 202. The track 202 is almost fully closed by the housing 200, except for the gap 244 between the first and second tabs 240, 242. The gap 244 is configured to accommodate the mechanical standoffs 172 (shown in FIG. 2) that mount the power rail 146 (FIG. 2) to the chassis 104 (FIG. 2). As the slide power connector 148 moves past a mechanical standoff 172, the mechanical standoff 172 aligns with and is received into the gap 244 to prevent the slide power connector 148 from stubbing on the standoff 172.

The power contacts 220 are exposed in the track 202 for electrical connection with the power rail 146 (shown in FIG. 4) when received in the track 202. In the illustrated embodiment, the power contacts 220 are mounted to the tabs 240, 242 of the second wall 236. The power contacts 220 project from interior surfaces 246 of the tabs 240, 242 into the track 202. The power contacts 220 project into the track 202 in a direction towards the mounting side 238 of the housing 200. The positive contact 220A of the power contacts 220 may be mounted to the first tab 240, and the ground contact 220B may be mounted to the second tab 242. The positive contact 220A and the ground contact 220B are disposed on opposite sides of the gap 244.

In an embodiment, the power contacts 220 include spring beams 256 for engaging the power rail 146 (shown in FIG. 4) that is disposed within the track 202. The spring beams 256 are deflectable such that the spring beams 256 may be spring-loaded against the power rail 146. Optionally, overtravel blocks may be provided behind the spring beams 256 to limit over-stress and/or deformation of the spring beams 256. Each of the power contacts 220 includes multiple spring beams 256 in the illustrated embodiment. The spring beams 256 have fixed ends 258 attached to the contact feed frame 222 and distal ends 260 opposite the fixed ends 258. The distal ends 260 engage the power rail 146. The distal ends 260 may be curved to prevent stubbing against the power rail 146 as the slide power connector 148 is slid along the power rail 146. Optionally, the spring beams 256 may extend in different directions. For example, each of the power contacts 220 may have a first set 262 of spring beams 256 that extend from the contact feed frame 222 towards the first end 230 of the housing 200 and a second set 264 of spring beams 256 that extend from the contact feed frame 222 towards the second end 232. The first set 262 extends in an opposite direction as the second set 264 in the illustrated embodiment. Optionally, both sets 262, 264 of spring beams 256 extend parallel to the longitudinal axis 266 of the track 202, which is parallel to the rail axis 147 (shown in FIG. 4) of the power rail 146. In an alternative embodiment, the power contacts 220 may be oriented such that all of the spring beams 256 of each power contact 220 extend in the same direction.

The housing 200 optionally has rabbit ear extensions 268 that project from the second end 232 and at least partially surround exposed end segments 270 of the power wires 150 terminated to the frame members 224, 226 of the contact feed frame 222. The rabbit ear extensions 268 may be integral parts of the housing 200 designed to reduce the risk of accidental electrical shocks by contacting the exposed end segments 270 and/or the proximal ends 228 of the frame members 224, 226.

Figure 7:
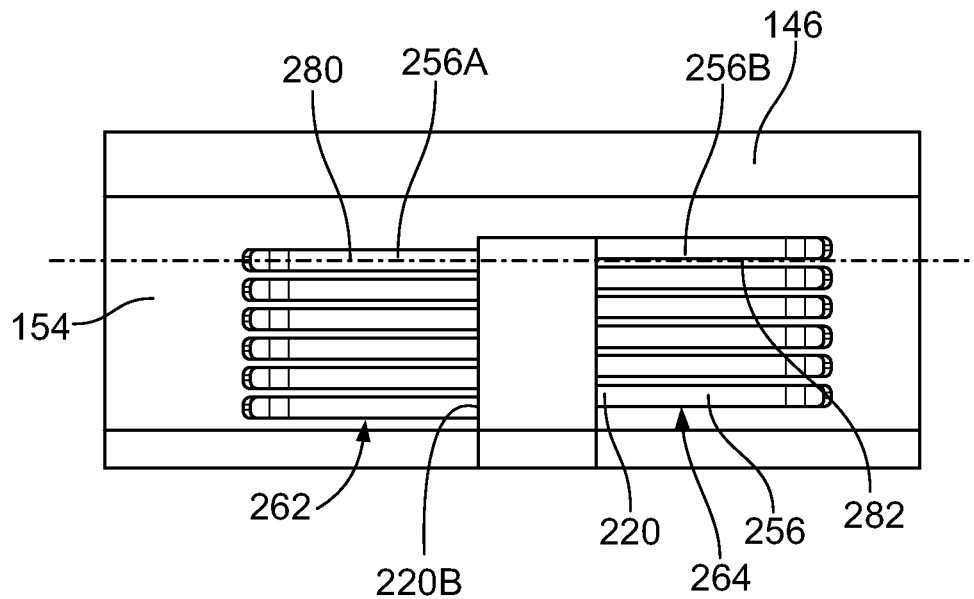
FIG. 7 is a plan view of a portion of the power connector assembly showing a power contacts in engagement with the power rail according to an embodiment.

FIG. 7 is a plan view of a portion of the power connector assembly 130 showing one of the power contacts 220 in engagement with the power rail 146 according to an embodiment. For example, FIG. 7 may look down through the second tab 242 (shown in FIG. 6) of the housing 200 (FIG. 6) to show the ground power contact 220B and the cathode 154 of the power rail 146. Optionally, the spring beams 256 of the first set 262 of the power contact 220 may be laterally offset from the spring beams 256 of the second set 264 of the power contact 220. The offset spring beams 256 may prevent or at least prohibit the formation of wear tracks along the power rail 146 due to the engagement of the spring beams 256 as the slide power connector 148 (shown in FIG. 6) is moved relative to the power rail 146. In the illustrated embodiment, a reference line 280 bisects an outer spring beam 256A of the first set 262, such that the reference line 280 extends along a center line of the spring beam 256A. The same reference line 280 aligns with an edge 282 of an outer spring beam 256B of the second set 264. Thus, the center of the outer spring beam 256A engages the same portion of the power rail 146 as the edge 282 of the outer spring beam 256B. If there is a consistent high spot on the spring beams 256A, such as at the centers, then any wear tracks formed by the first set 262 of spring beams 256 will be offset at different locations than wear tracks formed by the second set 264, which may significantly diminish the size/or and depth of the wear tracks relative to the wear tracks that would be formed if the first set 262 was not offset from the second set 264. Offsetting the spring beams 256 as shown in FIG. 7 may extend the usable lifetime of the power rail 146 and/or the contacts 220 of the slide power connector 148.

Figure 8:
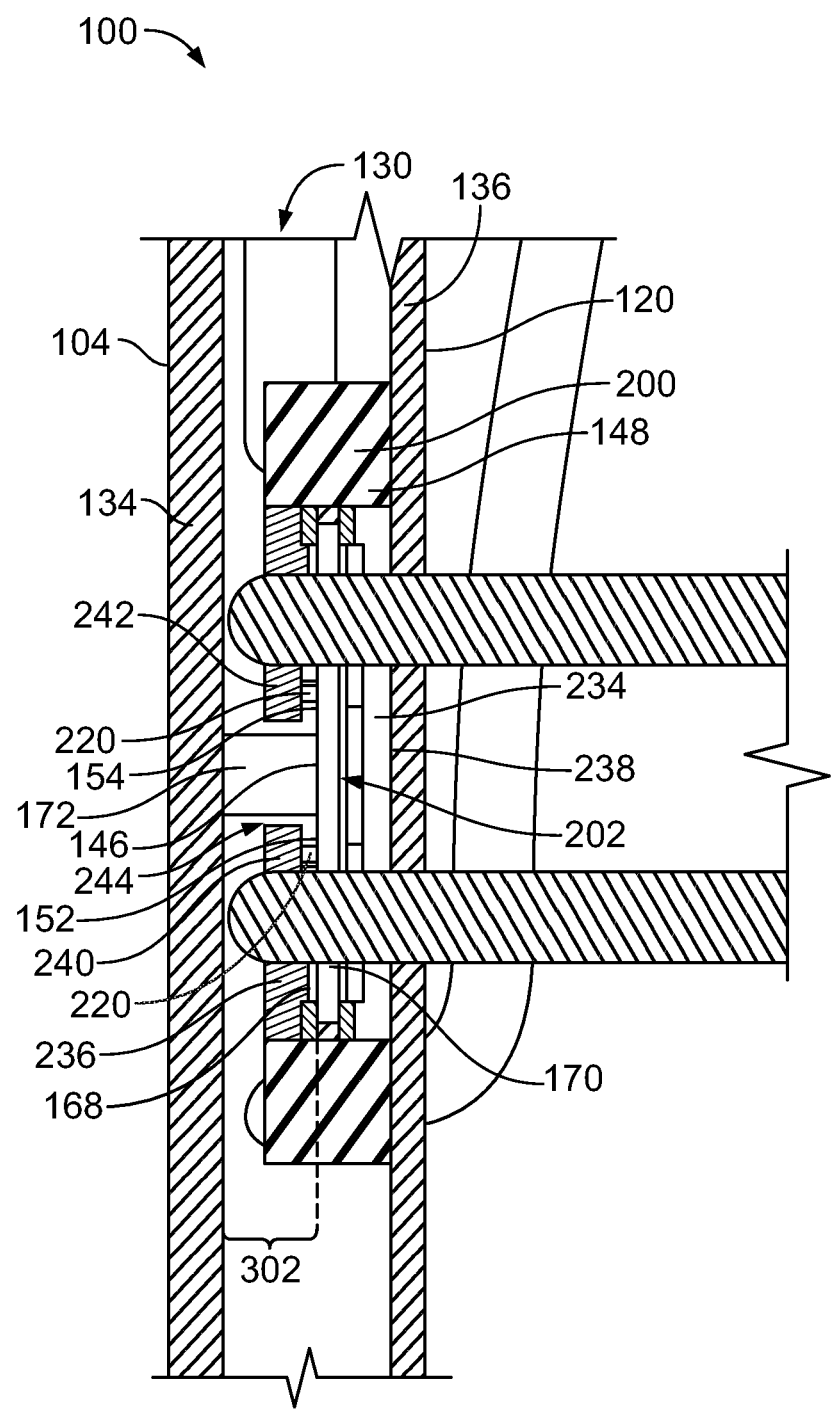
FIG. 8 is a rear view of a portion of the communication system according to the embodiment shown in FIG. 2.

FIG. 8 is a rear view of a portion of the communication system 100 according to the embodiment shown in FIG. 2. FIG. 8 shows the power connector assembly 130 mounted between the side panel 134 of the chassis 104 and the first side wall 136 of the drawer 120. The back wall 140 of the drawer 120 is omitted in FIG. 8. The slide power connector 148 is mounted to the first side wall 136 such that the mounting side 238 of the housing 200 engages the first side wall 136. The housing 200 may be mounted to the drawer 120 via fasteners (not shown), an adhesive, and/or the like.

The power rail 146 is mounted to the side panel 134 of the chassis 104 via the mechanical standoffs 172 (only one standoff 172 is visible in FIG. 8). The standoffs 172 may be or include fasteners, hollow spacers, posts, or the like. The standoffs 172 are located between the power rail 146 and the side panel 134. The standoffs 172 suspend the power rail 146 a distance away from the side panel 134 to define a clearance space 302 between the power rail 146 and the side panel 134. The mechanical standoffs 172 span the clearance space 302. The power rail 146 in the illustrated embodiment is indirectly mounted to the chassis 104 via the standoffs 172. The power rail 146 is planar and is held at an orientation that is parallel to both the side panel 134 and the first side wall 136 of the drawer 120.

The power rail 146 is disposed within the track 202 of the slide power connector 148 in FIG. 8. The second wall 236 of the housing 202 is located in the clearance space 302 between the power rail 146 and the side panel 134. The standoff 172 projects through the gap 244 in the second wall 236 between the first tab 240 and the second tab 242 of the housing 200. As the drawer 120 is moved along the extension cycle relative to the chassis 104, the relative movement between the power rail 146 and the slide power connector 148 is into and out of the page based on the orientation shown in FIG. 8.

The power rail 146 is mounted such that a first side of the power rail 146 (e.g., the outer side 168) faces the side panel 134 and a second side of the power rail 146 opposite the first side (e.g., the inner side 170) faces the first side wall 136 of the drawer 120. As described with reference to FIG. 3, the anode 152 and the cathode 154 are both located along the outer side 168 of the power rail 146. The power contacts 220 held by the first and second tabs 240, 242 of the housing 200 are disposed within the clearance space 302 and engage the corresponding electrodes 152, 154. The power rail 146 in the illustrated embodiment may be relatively touch-safe, even when the drawer 120 is in the open position. For example, the "hot" anode 152 is disposed along the outer side 168 of the power rail 146 facing the side panel 134. An operator would not be shocked upon contacting the inner side 170 of the power rail 146 that is exposed. The clearance space 302 between the side panel 134 and the power rail 146 may be sufficiently narrow to reduce the risk of an operator unintentionally contacting the electrodes 152, 154, either directly or with a tool. The width of the clearance space 302 (e.g., the distance from the power rail 146 to the side panel 134) may be sized narrower than a thickness or width of an adolescent human finger to reduce the risk of human touch contact with the anode 152 that could cause a shock. The adolescent human finger mentioned above may represent a finger that is at least as wide as an index finger of a 10-year-old female in the $25^{th}$ percentile of height and/or weight, because almost all fingers that would encounter the power rail 146 would be larger than this lower limit finger size.

Optionally, the width of the clearance space 302 may be equal to or less than 2 cm, such as no greater than 1 cm, no greater than 0.5 cm, or the like. The first and second tabs 240, 242 and the power contacts 220 held by the tabs 240, 242 are sized to fit within the narrow clearance space 302. Thus, an overall thickness of the tabs 240, 242 and contacts 220 is at least slightly less than the width of the clearance space 302 to enable the contacts 220 to electrically connect to the anode 152 and slide relative to the anode 152 without being mechanically compressed (e.g., squeezed) between the power rail 146 and the side panel 134. In an embodiment, the width of the clearance space 302 is less than an overall thickness of the entire connector 148, such that the clearance space 302 is specifically sized to only accommodate the tabs 240, 242 and the power contacts 220 held by the tabs 240, 242 (e.g., not additional portions of the connector 148. In addition to being touch-safe for prohibiting electrical shocks, the narrow clearance space 302 may protect the power connector assembly 130 against damage from tools and the like because the power components such as the electrodes 152, 154 and the power contacts 220 are relatively concealed within the narrow clearance space 302.

Figure 9:
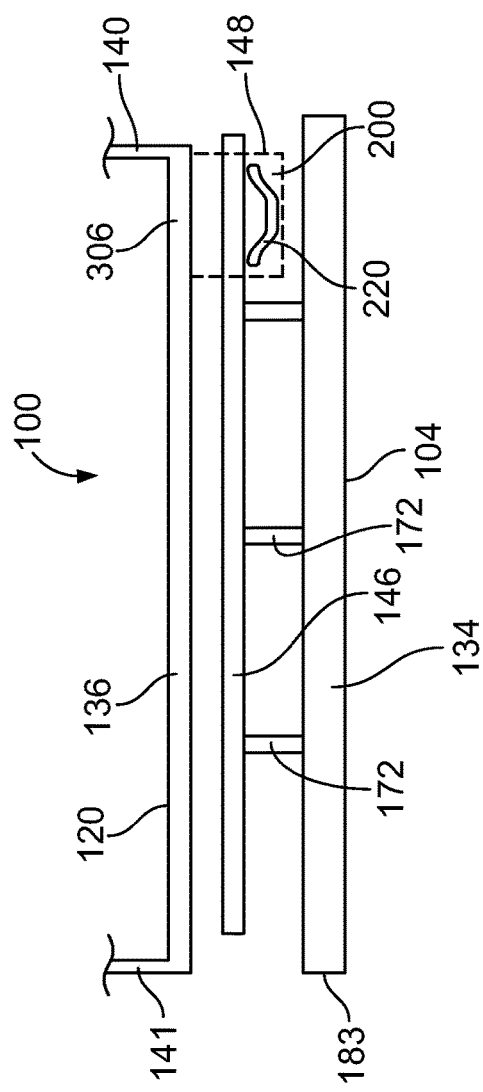
FIG. 9 illustrates a portion of the communication system showing a drawer of one of the equipment racks in a closed position.
Figure 10:
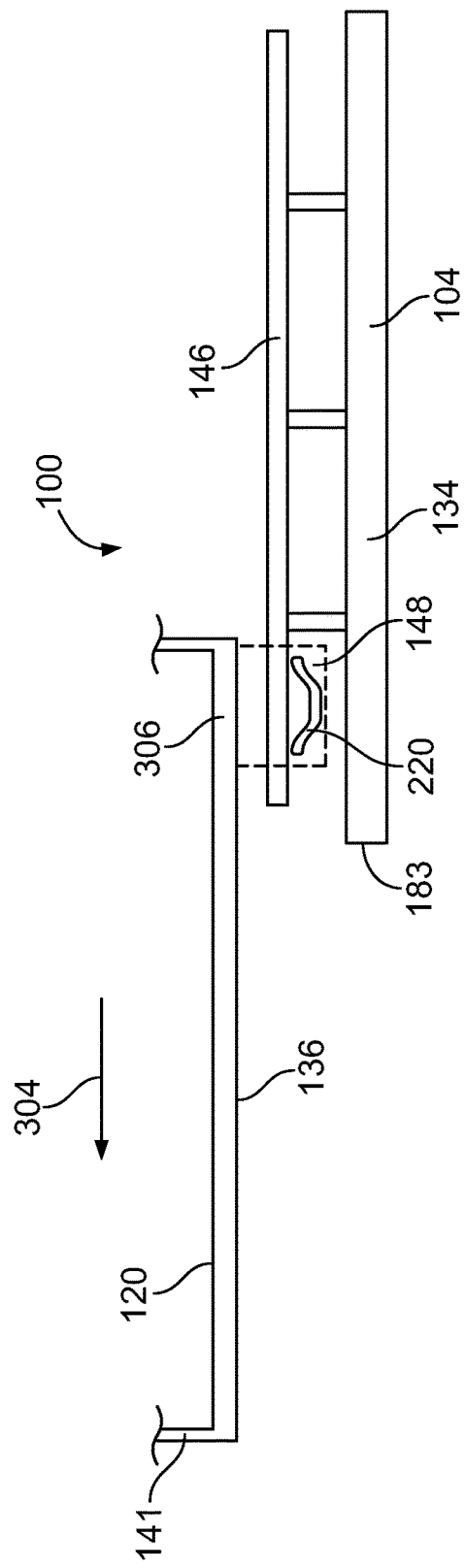
FIG. 10 illustrates a portion of the communication system showing the drawer of FIG. 9 in an open position.

FIG. 9 illustrates a portion of the communication system 100 showing the drawer 120 of one of the equipment racks 110 (shown in FIG. 1) in the closed position. FIG. 10 illustrates a portion of the communication system 100 showing the drawer 120 of FIG. 9 in the open position. FIGS. 9 and 10 are both top-down views that show only a portion of the drawer 120 including the first side wall 136 and short segments of the front wall 141 and the back wall 140. The slide power connector 148 is mounted to the first side wall 136 of the drawer 120 along a back segment 306 that is proximate to the back wall 140. The housing 200 of the slide power connector 148 is shown in phantom in FIGS. 9 and 10 to illustrate one of the power contacts 220 electrically connected to the power rail 146. The power rail 146 is mounted to the side panel 134 of the chassis 104 via the mechanical standoffs 172.

In the closed position shown in FIG. 9, the drawer 120 is generally centered over and aligned with the power rail 146 and the side panel 134 of the chassis 104. For example, the front wall 141 of the drawer 120 may align with or may be slightly recessed rearward from the front 183 of the chassis 104 in the closed position. As the equipment rack 110 (shown in FIG. 1) is opened, the drawer 120 moves in a forward direction 304 relative to the chassis 104 because the chassis 104 remains stationary. The slide power connector 148 mounted on the drawer 120 moves with the drawer 120 relative to the power rail 146 mounted on the chassis 104.

In the open position shown in FIG. 10, the drawer 120 is shifted and offset from the chassis 104 and the power rail 146. The drawer 120 projects beyond the front 183 of the chassis 104 such that the front wall 141 extends well forward of the front 183. Only the back segment 306 of the drawer 120, on which the slide power connector 148 is mounted, aligns with the power rail 146. The power contact 220 maintains electrical connection with the power rail 146 during the entire extension cycle between the closed and open positions.

Figure 11:
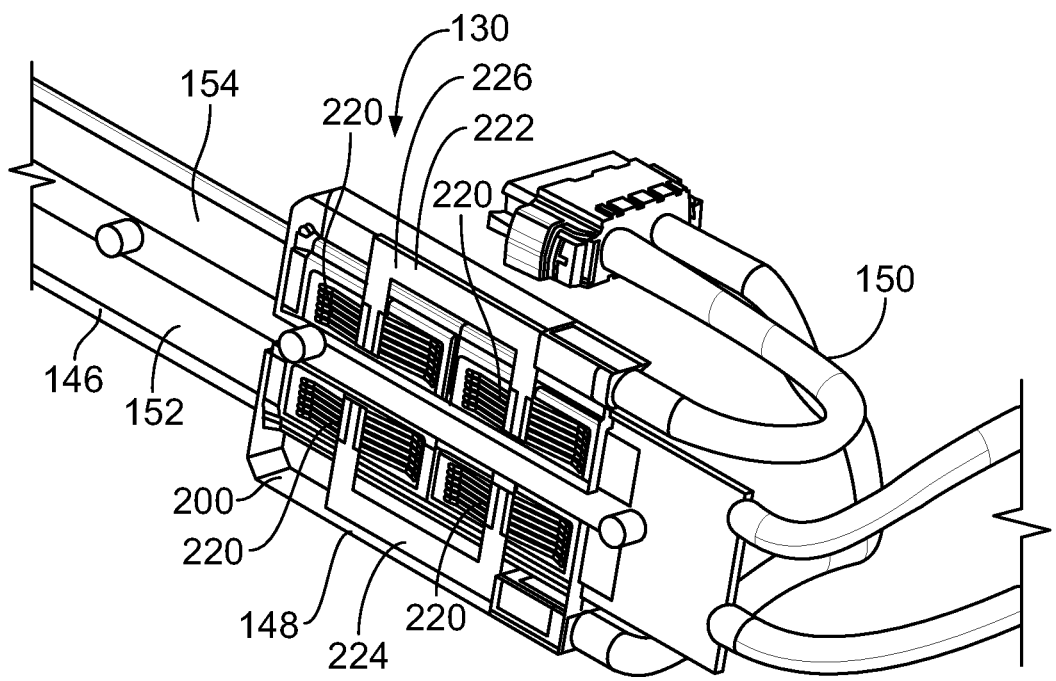
FIG. 11 is a perspective view of the power connector assembly of the communication system according to another embodiment.

FIG. 11 is a perspective view of the power connector assembly 130 of the communication system 100 according to another embodiment. The slide power connector 148 of the power connector assembly 130 in the illustrated embodiment differs from the slide power connector 148 shown in FIGS. 4 and 6 in the number of power contacts 220. The slide power connector 148 in FIG. 11 has twice the number of power contacts 220 as the embodiment shown in FIGS. 4 and 6. The housing 200 of the slide power connector 148 is transparent in FIG. 11 to show the power contacts 220 and the contact feed frame 222. The positive frame member 224 of the contact feed frame 222 is mechanically and electrically connected to two power contacts 220, which represent anode or positive contacts. Both of the positive contacts 220 engage the anode 152 of the power rail 146. The negative (or ground) frame member 226 of the contact feed frame 222 is also mechanically and electrically connected to two power contacts 220, which represent ground contacts. The ground contacts 220 both engage the cathode 154 of the power rail 146. The slide power connector 148 has a total of four power contacts 220 in FIG. 11. Increasing the number of power contact 220 may increase the current carrying capacity of the slide power connector 148 due to a greater contact surface area between the power contacts 220 and the electrodes 152, 154 of the power rail 146. The slide power connector 148 may have more than four power contacts 220 in other embodiments.

Figure 12:
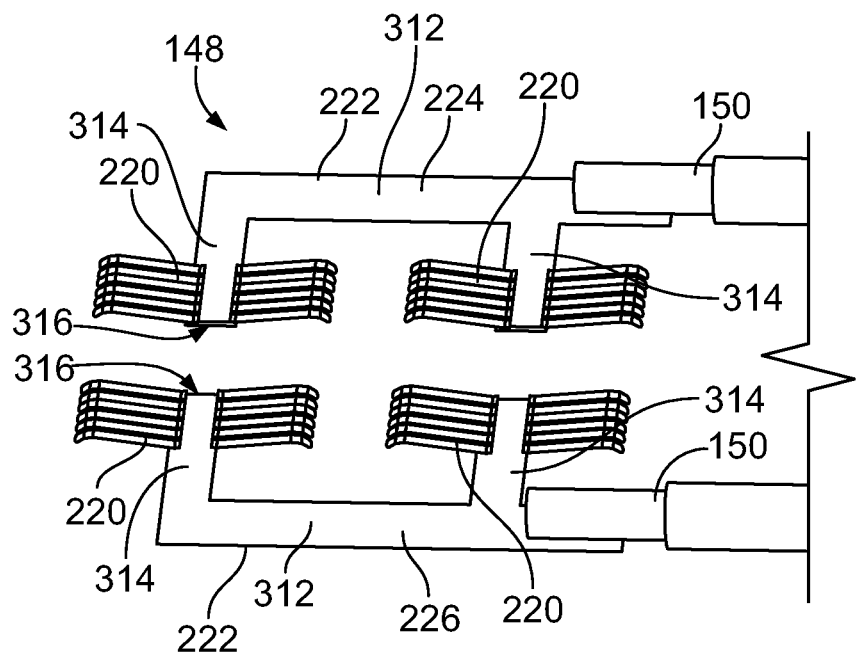
FIG. 12 is an isolated perspective view of the power contacts and a contact feed frame of the slide power connector shown in FIG. 11, with a housing removed for clarity.

FIG. 12 is an isolated perspective view of the power contacts 220 and the contact feed frame 222 of the slide power connector 148 shown in FIG. 11, with the housing 200 removed for clarity. Each of the positive and negative frame members 224, 226 of the contact feed frame 222 has a trunk 312 and two branches 314 extending from the trunk 312 at different locations along the length thereof. The trunks 312 of the positive and negative frame members 224, 226 are oriented parallel to each other. The branches 314 extend from the respective trunks 312 towards the branches 314 of the other frame member, without engaging the other branches 314. The power wires 150 are terminated to the trunks 312. The power contacts 220 are attached to distal ends 316 of the branches 314.

Figure 13:
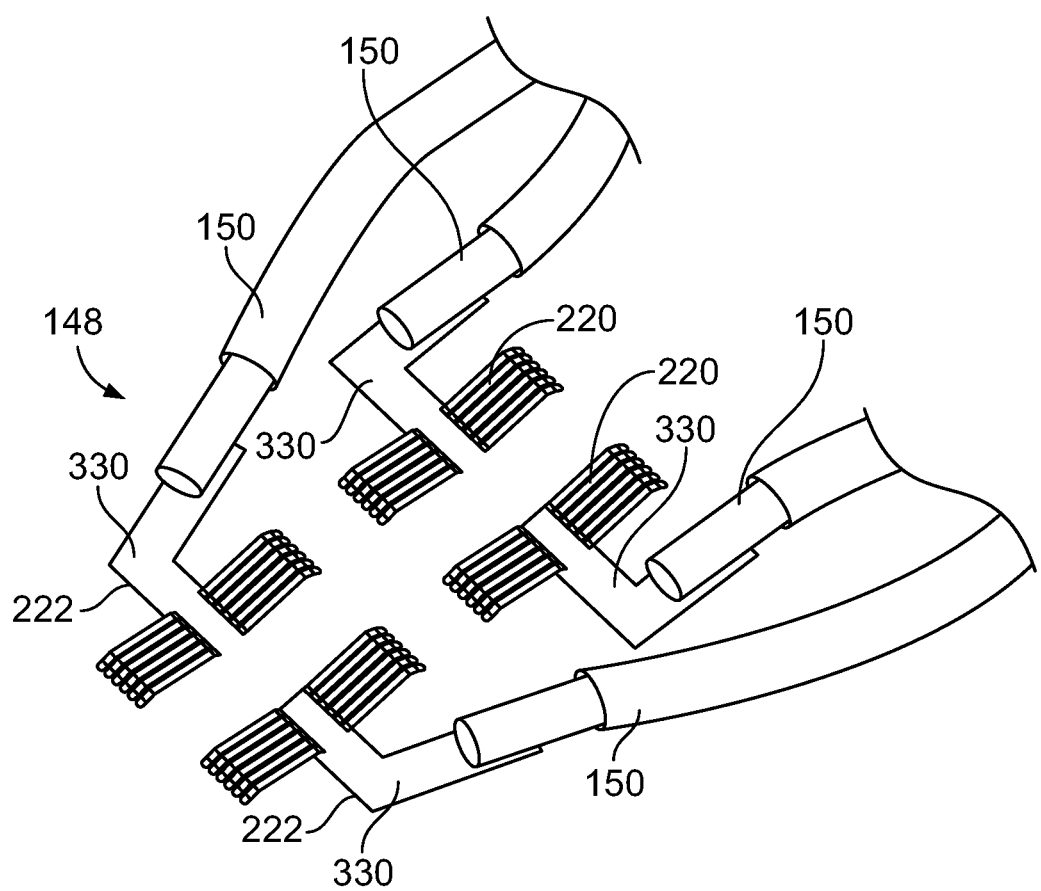
FIG. 13 is an isolated perspective view of the slide power connector of the power connector assembly according to an alternative embodiment, with the housing removed for clarity.

FIG. 13 is an isolated perspective view of the slide power connector 148 of the power connector assembly 130 according to an alternative embodiment, with the housing 200 removed for clarity. The slide power connector 148 in FIG. 13 has the same number and arrangement of power contacts 220 as the slide power connector 148 shown in FIGS. 11 and 12, but the contact feed frame 222 is segmented into four discrete frame members 330. Each of the frame members 330 is welded (e.g., soldered or the like) to a different power wire 350. Thus, the slide power connector 148 in the illustrated embodiment is terminated to four power wires 350 instead of two power wires 150 as in the previously-described embodiments. The four power wires 350 may all connect to the plug connector 178 (shown in FIG. 2) within the cavity 144 of the drawer 120. Alternatively, the four power wires 350 may connect to multiple different connectors. The four power wires 350 shown in FIG. 13 may have smaller individual sizes (e.g., diameter, gauge, etc.) than the two power wires 150 shown in FIGS. 11 and 12. Each frame member 330 holds a different one of the power contacts 220 and provides an electrically conductive path from the power contact 220 to the corresponding power wire 350 terminated to the frame member 330.

Figure 14:
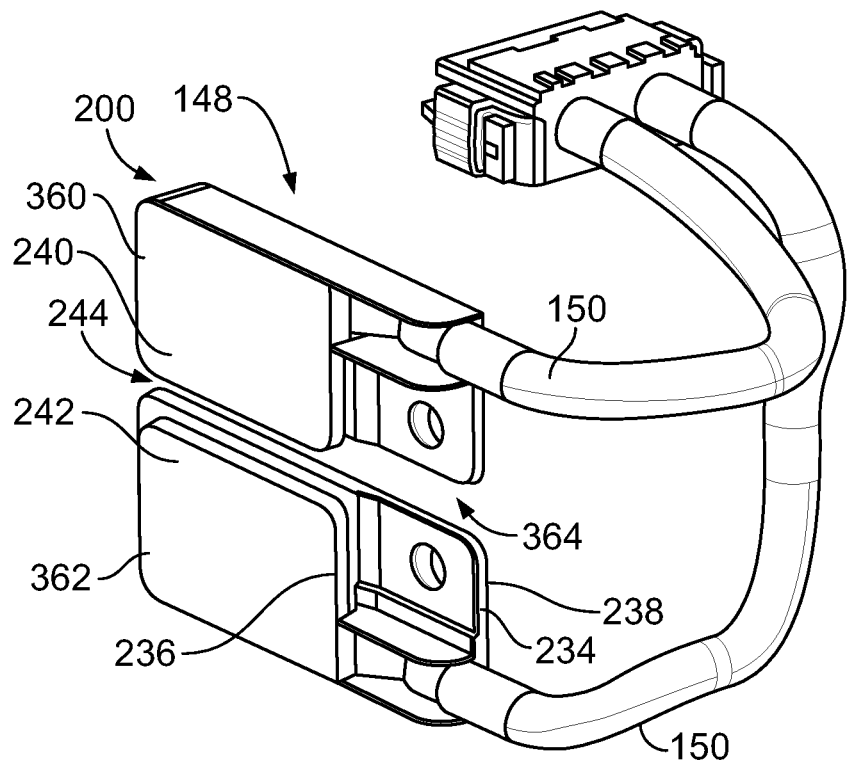
FIG. 14 is a perspective view of a portion of the power connector assembly showing another embodiment of the slide power connector.
Figure 15:
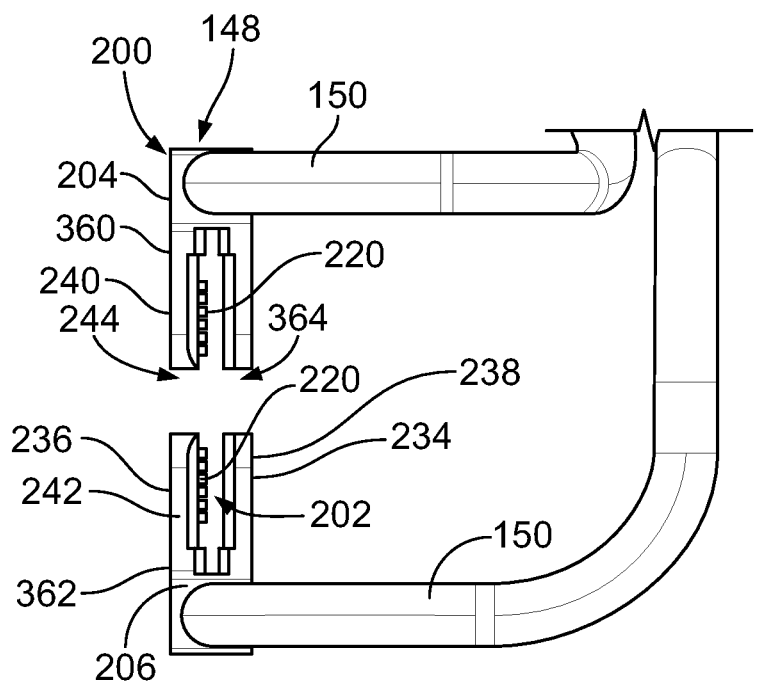
FIG. 15 is a rear view of the slide power connector shown in FIG. 14.

FIG. 14 is a perspective view of a portion of the power connector assembly 130 showing another embodiment of the slide power connector 148. FIG. 15 is a rear view of the slide power connector 148 shown in FIG. 14. The slide power connector 148 in FIGS. 14 and 15 differs from the slide power connector 148 shown in previous figures (e.g., FIGS. 6 and 8) because the housing 200 is separated into first and second discrete housing members 360, 362. For example, the first wall 234 of the housing 200 that includes the mounting side 238 is split in half. The first wall 234 defines a gap 364 that generally aligns with the gap 244 in the second wall 236 between the first and second tabs 240, 242. The first housing member 360 is terminated to one of the power wires 150 and holds one of the power contacts 220. The second housing member 362 is terminated to the other power wire 150 and holds the other power contact 220. The slide power connector 148 in the illustrated embodiment may function the same as the slide power connector 148 shown in FIGS. 4 and 6.

A benefit of the two-piece housing 200 is that the slide power connector 148 may be able to accommodate power rails 146 of multiple different heights or widths in the dimension from the first edge 164 (shown in FIG. 3) to the second edge 166 (FIG. 3). For example, if the power rail 146 has a narrow height between the edges 164, 166, then the two housing members 360, 362 can be mounted close together on the drawer 120 (FIG. 2) of the equipment rack 110 (FIG. 2). Alternatively, if the power rail 146 has a greater height between the edges 164, 166, then the two housing members 360, 362 can be mounted farther apart from each other in order to expand the height of the track 202 between the two rails 204, 206 of the slide power connector 148.

Figure 16:
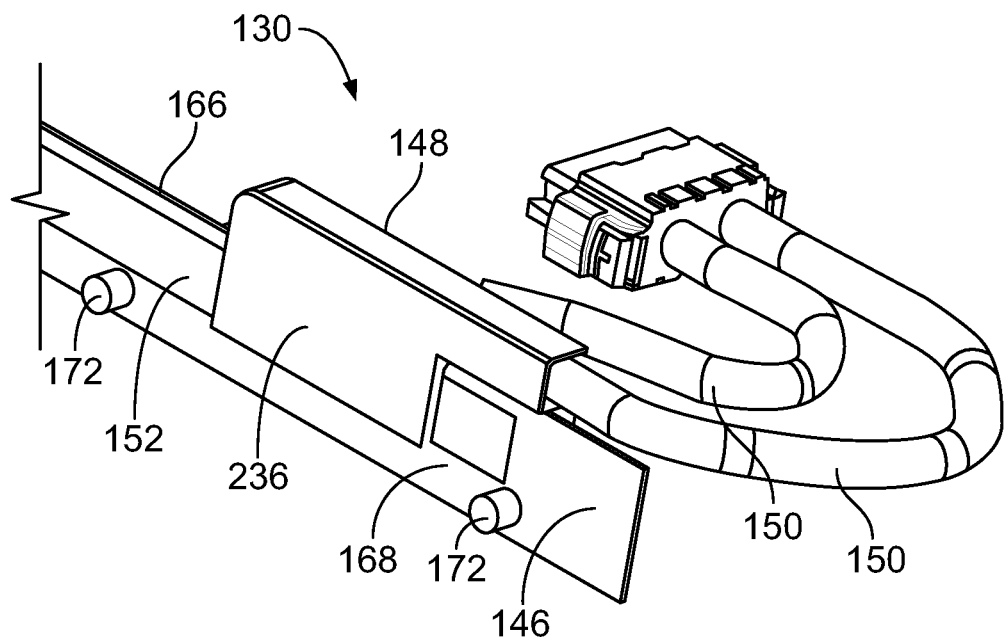
FIG. 16 is a first perspective view of the power connector assembly according to another embodiment.
Figure 17:
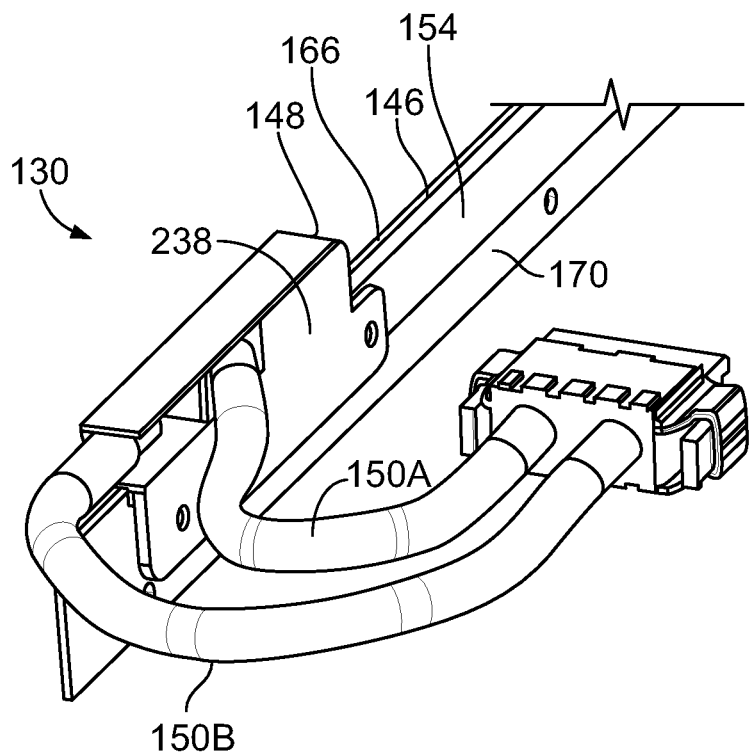
FIG. 17 is a second perspective view of the power connector assembly shown in FIG. 16.
Figure 18:
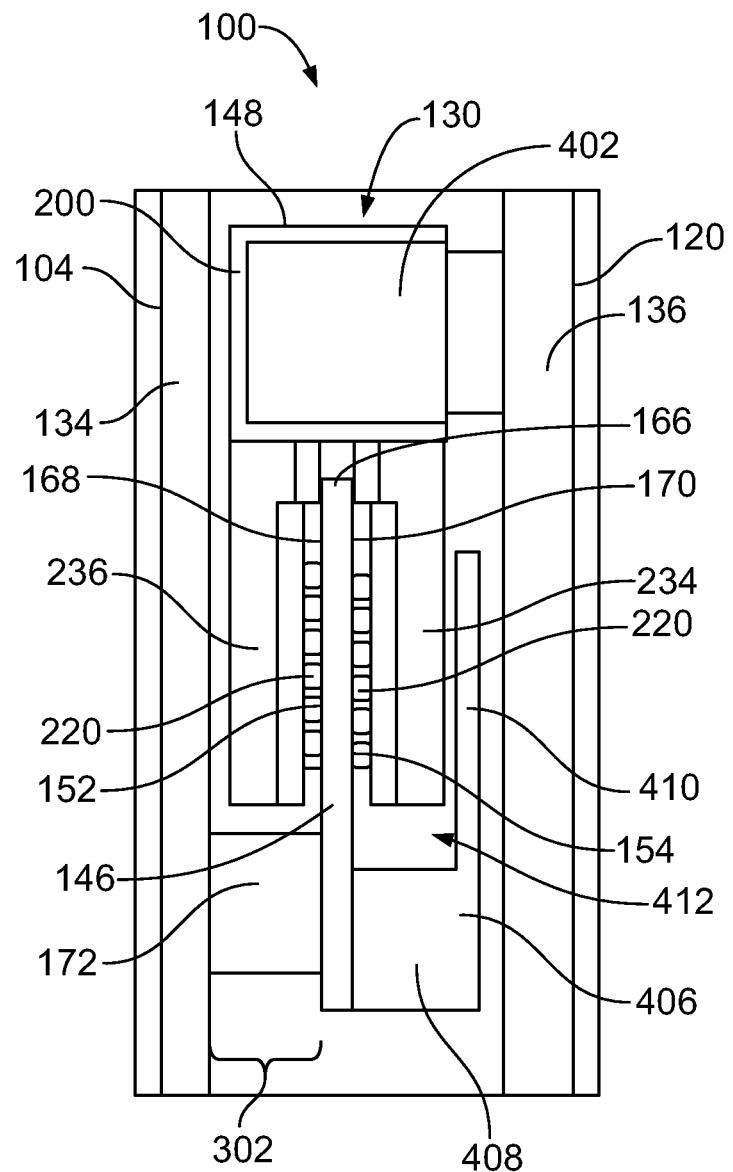
FIG. 18 is a rear view of a portion of the communication system according to the embodiment shown in FIGS. 16 and 17.

FIG. 16 is a first perspective view of the power connector assembly 130 according to another embodiment. FIG. 17 is a second perspective view of the power connector assembly 130 shown in FIG. 16. FIGS. 16 and 17 depict different angles of the power connector assembly 130, with FIG. 16 showing the outer side 168 of the power rail 146 and FIG. 17 showing the inner side 170 of the power rail 146. FIG. 18 is a rear view of a portion of the communication system 100 according to the embodiment shown in FIGS. 16 and 17. The power rail 146 is mounted to the side panel 134 of the chassis 104 via the mechanical standoffs 172 that project from the outer side 168. The slide power connector 148 is mounted to the side wall 136 of the drawer 120. The power connector assembly 130 in FIGS. 16 through 18 differs from previously-described embodiments because the anode 152 and the cathode 154 are disposed along different sides 168, 170 of the power rail 146, instead of being on the same side (e.g., the outer side 168 as shown in FIG. 8). Thus, the power rail 146 is double-sided.

The slide power connector 148 is reconfigured to accommodate the double-sided power rail 146. For example, the slide power connector 148 straddles the edge 166 of the power rail 146. The first wall 234 of the housing 200 is disposed along the inner side 170 of the power rail 146. The second wall 236 of the housing 200 extends into the clearance space 302 between the power rail 146 and the side panel 134 and extends along the outer side 168. Each of the first and second walls 234, 236 holds one or more power contacts 220 that engage the respective electrode 152, 154 on the corresponding side 168, 170 of the power rail 146.

In one embodiment, the anode 152 is disposed along the outer side 168 of the power rail 146 facing the side panel 134 of the chassis 104, and the cathode 154 is disposed along the inner side 170 of the power rail 146 facing the drawer 120. Placing the anode 152 along the outer side 168 may provide additional protection against inadvertent shocks, as described above with reference to FIG. 8, because the clearance space 302 between the side panel 134 and the power rail 146 may be narrow, yielding the anode 152 relatively inaccessible. Inadvertent contact with the cathode 154 along the inner side 170 may be unlikely to result in a shock as the cathode 154 represents a ground or return path.

Optionally, the power rail 146 may include or may be coupled to a cover 406 as shown in FIG. 18. The cover 406 extends generally parallel to the power rail 146. The cover 406 has a shoulder 408 and a shield 410. The shoulder 408 extends from the power rail 146 to the shield 410, such that the shield 410 is spaced apart from the power rail 146 to define a slot 412 therebetween above the shoulder 408. The housing 200 of the slide power connector 148 may be mounted to the drawer 120 along a top area 402 of the housing 200 which projects inward beyond the first wall 234 such that the first wall 234 is spaced apart from the side wall 136. The shield 410 is received between the first wall 234 and the side wall 136. The first wall 234 of the housing 200 is received within the slot 412. The shield 410 is disposed interior of the power rail 146 adjacent to the side wall 136 of the drawer 120. When the drawer 120 is in the open position and a length of the power rail 146 is exposed within the cabinet 102 (FIG. 1), the shield 410 of the cover 406 blocks accidental and inadvertent contact with the power rail 146. For example, the slot 412 may be relatively narrow, such that it is at least difficult to insert a finger into the slot 412 to engage the electrode(s) disposed along the inner side 170. With the addition of the cover 406, the anode 152 may be disposed on either of the sides 168, 170 of the power rail 146 with little to no risk of accidental shock or damage to the power rail 146. For example, in an alternative embodiment the anode 152 may be disposed on the inner side 170, and the cathode 154 on the outer side 168.

In the illustrated embodiment, both of the power cables 150 project from the top area 402 of the housing 200 above the edge 166 of the power rail 146. Optionally, one or both of the wires 150 may be angularly attached to the housing 200 such that the wire(s) 150 project from the housing 200 at an oblique angle that is neither parallel nor perpendicular to the planar mounting side 238 of the housing 200. The angular attachment may enable a reduced length of the wire(s) 150 relative to attaching the wires 150 parallel or perpendicular to the mounting side 238. In the illustrated embodiment, one of the wires 150A is angularly attached, and the other wire 150B is attached parallel to the mounting side 238.

Figure 19:
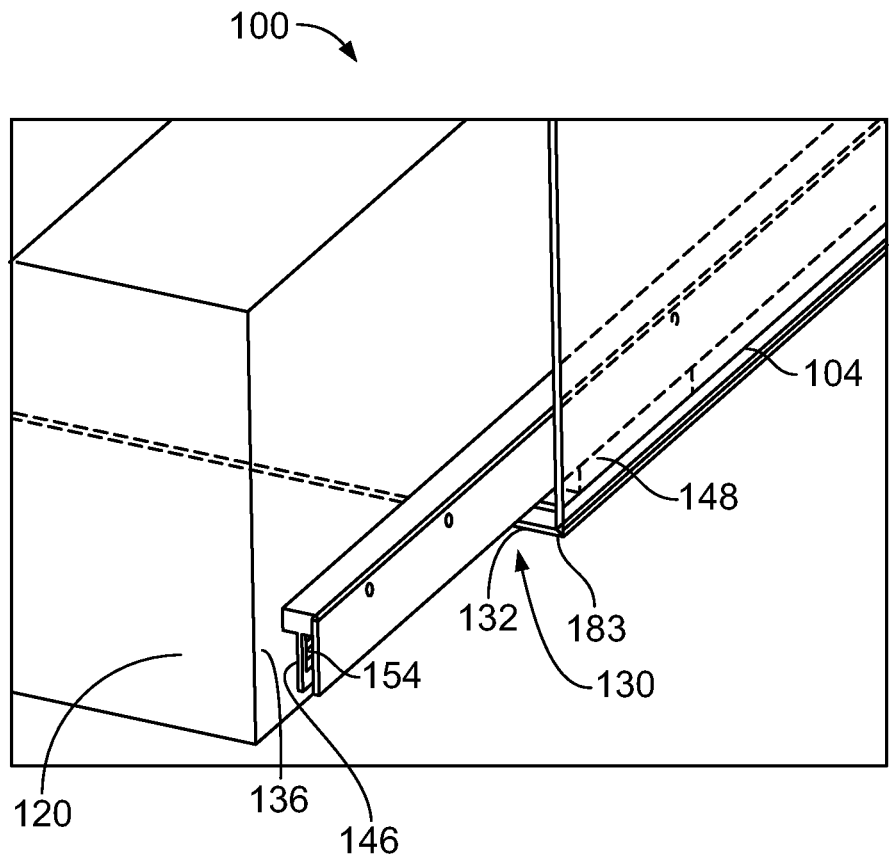
FIG. 19 is a front perspective view of the communication system according to an alternative embodiment showing a drawer of an equipment rack partially open.
Figure 20:
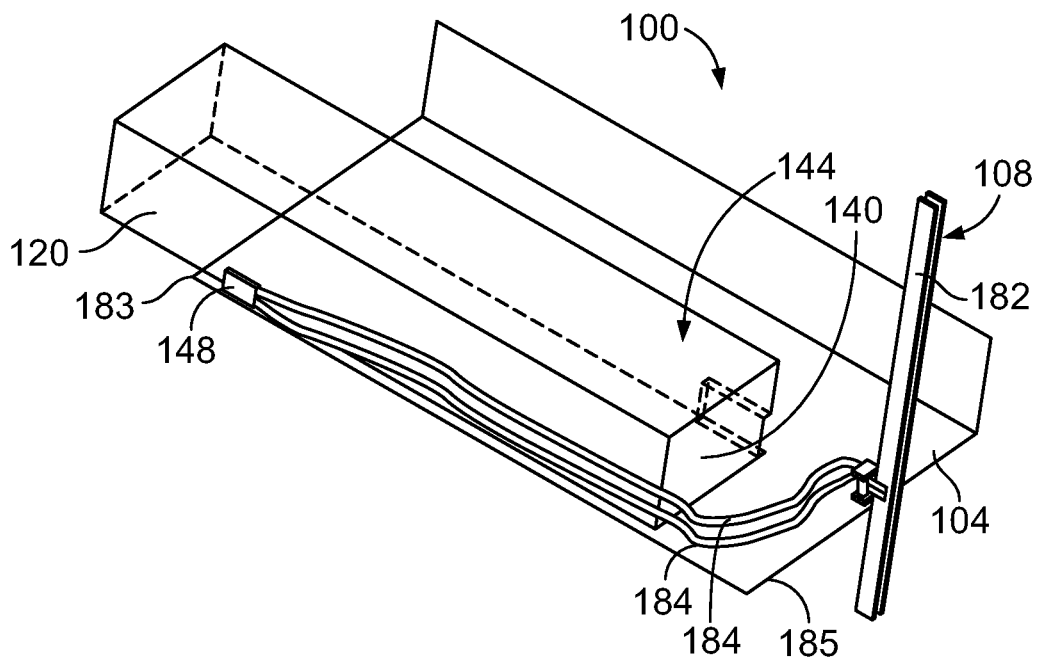
FIG. 20 is top perspective view of the communication system shown in FIG. 19 with the drawer partially open.
Figure 21:
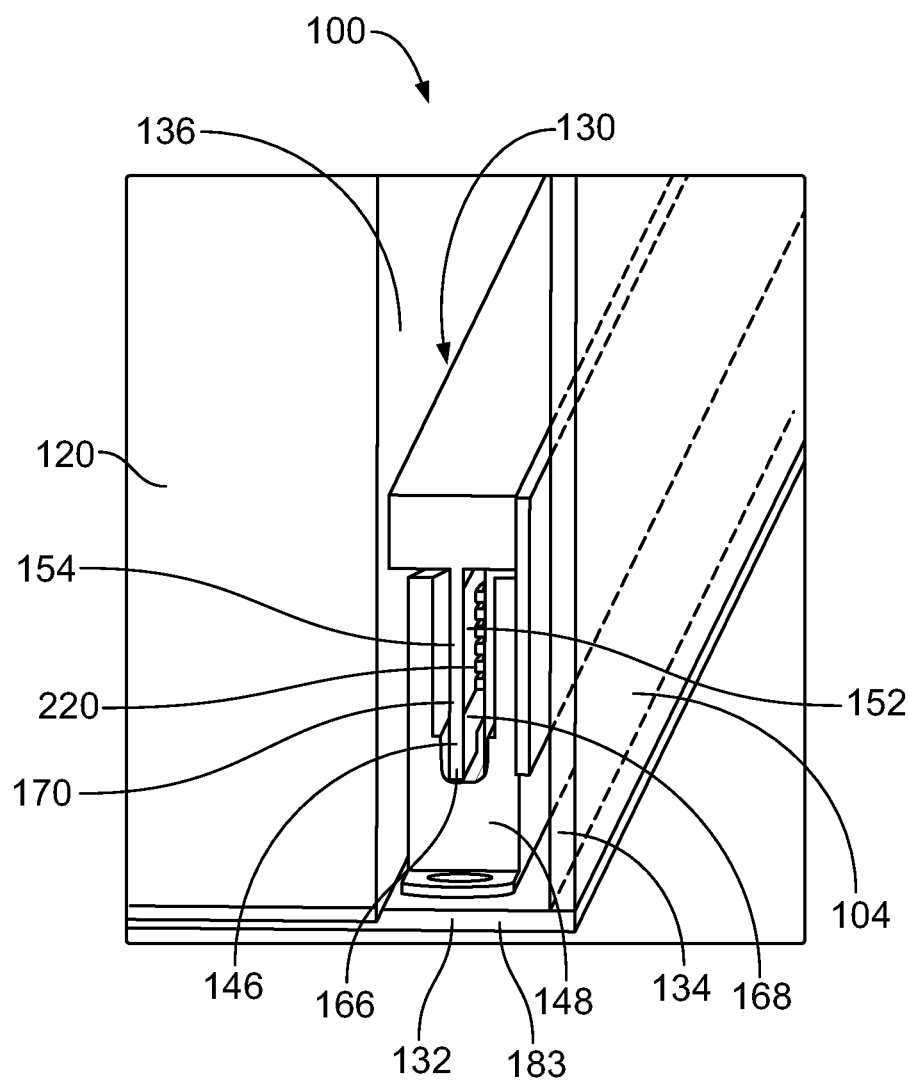
FIG. 21 is another front perspective view of the communication system shown in FIGS. 19 and 20 with the drawer in the closed position relative to the chassis.

FIGS. 19 through 21 show a portion of the communication system 100 according to yet another embodiment. FIG. 19 is a front perspective view of the communication system 100 showing a drawer 120 of an equipment rack 110 (shown in FIG. 1) partially open. FIG. 20 is top perspective view of the communication system 100 shown in FIG. 19 with the drawer 120 partially open. FIG. 21 is another front perspective view of the communication system 100 shown in FIGS. 19 and 20 with the drawer 120 in the closed position relative to the chassis 104.

In the illustrated embodiment shown in FIGS. 19 through 21, the power rail 146 is mounted to the drawer 120 and the slide power connector 148 is mounted to the chassis 104. For example, the power rail 146 is fixed to the side wall 136 of the drawer 120. The slide power connector 148 is mounted on the bottom panel 132 of the chassis 104, although the slide power connector 148 may be mounted on the side panel 134 in another embodiment. As the drawer 120 is opened and closed, the slide power connector 148 mounted on the chassis 104 remains stationary and the power rail 146 moves with the drawer 120 relative to the slide power connector 148. The power contacts 220 of the slide power connector 148 maintain electrical connection with the power rail 146 during the entire extension cycle between the closed and open positions, similar to other embodiments described herein.

In order to maintain the electrical connection throughout the entire extension cycle, the slide power connector 148 may be mounted at or proximate to the front 183 of the chassis 104. As the drawer 120 moves forward towards the open position, the back side 140 of the drawer 120 moves away from the rear 185 of the chassis 104. Even in the open position, the back side 140 of the drawer 120 remains rearward of the front 183 of the chassis 183. The slide power connector 148 is mounted at the front 183 in a location that aligns with the power rail 146 on the drawer 120 throughout the entire extension cycle. Optionally, the slide power connector 148 may be positioned rearward of the front 183 in another embodiment, such as mid-way between the front 183 and the rear 185 of the chassis 104.

As shown in FIG. 20, the power wires 184 that supply power from the power supply 108 (e.g., the power bus bar 182) to the power connector assembly 130 are electrically connected to the slide power connector 148. The power wires 184 have sufficient length to extend from the power bus bar 182 along the rear 185 of the chassis 104 to the slide power connector 148 at or proximate to the front 183. Because the slide power connector 148 and the power bus bar 182 are both stationary relative to the chassis 104, the distance between the slide power connector 148 and the power bus bar 182 is constant (e.g., there is no concern with the power wires 184 being extendable or retractable).

The power rail 146 mounted on the drawer 120 is connected to power wires (e.g., the power wires 150 shown in FIG. 2) that extend into the cavity 144 of the drawer 120 to electrically connect the power rail 146 to the communication equipment 106 (FIG. 1) within the drawer 120.

In the illustrated embodiment, the slide power connector 148 and the power rail 146 are constructed at least similar to the embodiment of the power connector assembly 130 shown in FIGS. 16 through 18. For example, the power rail 146 is double-sided with an electrode 152, 154 on each of the outer and inner sides 168, 170. The slide power connector 148 straddles a distal edge 166 of the power rail 146 and has power contacts 220 that engage both of the electrodes 152, 154. But, the slide power connector 148 and the power rail 146 may alternatively be constructed like other embodiments described herein. For example, the electrodes 152, 154 optionally may be disposed on the same side of the power rail 146.

At least one technical effect of the communication system 100 described herein is the ability to open an equipment rack 110 of a cabinet 102, for performing service or other tasks, without disrupting the power supply to the communication equipment 106 held on the equipment rack 110. For example, an operator can replace one electrical device on the equipment rack 110 with the rack 110 in the open position while other electrical devices on the equipment rack 110 maintain operation due to the uninterrupted power supply. Another technical effect of the communication system 100 is that there is flexibility in how the electrical devices of the equipment rack 110 are arranged. For example, a component of the power connector assembly 130 is mounted to a drawer 120 of the equipment rack 110 and power wires 150 extend from that component into a cavity 144 of the drawer 120 to power the electrical devices within the equipment rack 110. Due to the use of the power wires 150, the component of the power connector assembly 130 does not have to be connected directly to a circuit board, a power supply device, or another electrical component of the equipment rack 110. Yet another technical effect of the communication system 100 described herein is a reduced risk of shock or other harm caused by accidental or inadvertent contact with electrically charged (or live) components of the power connector assembly 130.

The above description is illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely example embodiments. Many other embodiments and modifications within the spirit and scope of the claims will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A power connector assembly comprising:
    a power rail mounted to a first wall of a first component via mechanical standoffs that suspend the power rail a distance away from the first wall to define a clearance space between the power rail and the first wall, the mechanical standoffs span the clearance space, wherein the power rail has a positive electrode disposed along a first side of the power rail facing the first wall; and
    a slide power connector including a housing and power contacts held in the housing, the slide power connector mounted to a second wall of a second component that is discrete from the first component, the housing defining a track that receives the power rail therein, wherein at least one of the power contacts is disposed within the clearance space and is electrically connected to the positive electrode of the power rail to establish an electrical connection between the slide power connector and the power rail,
    wherein at least one of the first and second components is configured to be moved relative to the other of the first and second components along an extension cycle, and the electrical connection between the slide power connector and the power rail is maintained throughout the extension cycle.

2. The power connector assembly of claim 1, wherein the distance from the power rail to the first wall is less than 1 cm.

3. The power connector assembly of claim 1, wherein the distance from the power rail to the first wall is narrower than an adolescent human finger to prohibit human touch contact with the positive electrode of the power rail.

4. The power connector assembly of claim 1, wherein the positive electrode of the power rail provides current to the slide power connector and the power rail also includes a negative electrode that provides a ground or return path, the positive and negative electrodes extending parallel to each other along a length of the power rail.

5. The power connector assembly of claim 4, wherein the positive and negative electrodes are both disposed along the first side of the power rail that faces the first wall.

6. The power connector assembly of claim 4, wherein the negative electrode is disposed on a second side of the power rail opposite the first side such that the positive and negative electrodes are disposed along opposite sides of the power rail.

7. The power connector assembly of claim 1, wherein the power rail is elongated from a first end of the power rail to a second end of the power rail parallel to an axis of the extension cycle.

8. The power connector assembly of claim 1, wherein the power rail is mounted to a chassis that represents the first component and the slide power connector is mounted to a drawer that represents the second component, the drawer held by the chassis and is moved relative to the chassis along the extension cycle, wherein the slide power connector mounted to the drawer is outside of a cavity of the drawer and is electrically connected to one or more electrical devices within the cavity of the drawer via power wires that extend from the slide power connector into the cavity.

9. The power connector assembly of claim 1, wherein the power rail is mounted to a drawer that represents the first component and the slide power connector is mounted to a chassis that represents the second component, the drawer held by the chassis and moves relative to the chassis along the extension cycle, wherein the power rail mounted to the drawer is outside of a cavity of the drawer and is electrically connected to one or more electrical devices within the cavity of the drawer via power wires that extend from the power rail into the cavity.

10. The power connector assembly of claim 1, wherein the housing of the slide power connector defines a gap along a length of the slide power connector to accommodate the mechanical standoffs as the slide power connector moves past the mechanical standoffs along the extension cycle.

11. The power connector assembly of claim 1, wherein the power contacts of the slide power connector include deflectable spring beams that mechanically engage the power rail, wherein the spring beams are spring-loaded against the power rail to maintain contact with the power rail throughout the extension cycle.

12. The power connector assembly of claim 11, wherein each of the power contacts includes a first set of the deflectable spring beams and a second set of the deflectable spring beams that extends in an opposite direction as the first set.

13. The power connector assembly of claim 1, wherein the power rail includes one or more heat sinks mounted on the power rail, the one or more heat sinks located on the power rail outside of a travel path of the slide power connector to avoid obstructing with the relative movement of the slide power connector and the power rail.

14. The power connector assembly of claim 1, wherein the housing of the slide power connector is defined by a first housing member and a second housing member, the first and second housing members being separate and discrete, each of the first and second housing members holding at least one respective power contact of the power contacts.

15. A power connector assembly comprising:
a power rail mounted to a panel of a chassis via mechanical standoffs that suspend the power rail a distance away from the panel to define a clearance space between the power rail and the panel, the mechanical standoffs span the clearance space, the power rail having a power supply circuit electrically connected to a power supply, wherein the power supply circuit includes a positive electrode disposed along an outer side of the power rail facing the panel; and
a slide power connector mounted to a drawer that is held by the chassis, the drawer slidable relative to the chassis along an extension cycle, the slide power connector electrically connected to one or more electrical devices disposed within a cavity of the drawer via power wires that extend into the cavity, the slide power connector having power contacts electrically connected to the power supply circuit of the power rail, wherein at least one of the power contacts is disposed within the clearance space and is electrically connected to the positive electrode to establish an electrical connection between the slide power connector and the power rail, wherein the slide power connector is configured to slide along the power rail as the drawer is moved relative to the chassis, and the power contacts maintain electrical connection with the power supply circuit throughout the extension cycle.

16. The power connector assembly of claim 15, wherein the power contacts of the slide power connector are mounted to corresponding frame members of a contact feed frame, each of the frame members having a proximal end mechanically and electrically connected to a respective one of the power wires and at least one distal end mechanically and electrically connected to a respective one of the power contacts.

17. The power connector assembly of claim 15, wherein the slide power connector includes a housing, the housing including a first rail and a second rail that define a track therebetween for receiving the power rail such that the first rail is configured to engage a first edge of the power rail and the second rail is configured to engage a second edge of the power rail, the housing further including a first tab that extends from the first rail and a second tab that extends from the second rail, the first and second tabs are disposed within the clearance space and define a gap therebetween to accommodate the mechanical standoffs as the slide power connector moves past the mechanical standoffs along the extension cycle.

18. The power connector assembly of claim 15, wherein the slide power connector includes a housing defined by a first housing member and a second housing member, the first and second housing members being separate and discrete, each of the first and second housing members holding at least one respective power contact of the power contacts.

19. A power connector assembly comprising:
a power rail mounted to a first wall of a first component via mechanical standoffs that suspend the power rail a distance away from the first wall to define a clearance space between the power rail and the first wall, the mechanical standoffs span the clearance space, wherein the power rail has a positive electrode disposed along a first side of the power rail facing the first wall and has a negative electrode disposed along a second side of the power rail that is opposite the first side; and
a slide power connector including a housing and power contacts, the slide power connector mounted to a second wall of a second component that is discrete from the first component, the housing including a rail and first and second walls that extend from the rail, the housing configured to straddle an edge of the power rail such that the first wall is disposed along the first side of the power rail within the clearance space and the second wall is disposed along the second side of the power rail, the first wall holding at least a first power contact of the power contacts that is electrically connected to the positive electrode, the second wall holding at least a second power contact of the power contacts that is electrically connected to the negative electrode,
wherein at least one of the first and second components is configured to be moved relative to the other of the first and second components along an extension cycle, and the electrical connection between the slide power connector and the power rail is maintained throughout the extension cycle.

20. The power connector assembly of claim 19, wherein the power rail includes a cover that extends along a length of the power rail to block inadvertent contact with the positive electrode or the negative electrode of the power rail.

* * * * *